US012176215B2

(12) United States Patent
Hinode et al.

(10) Patent No.: US 12,176,215 B2
(45) Date of Patent: Dec. 24, 2024

(54) SUBSTRATE PROCESSING APPARATUS, SUBSTRATE PROCESSING METHOD, AND NON-TRANSITORY COMPUTER-READABLE STORAGE MEDIUM

(71) Applicant: SCREEN Holdings Co., Ltd., Kyoto (JP)

(72) Inventors: Taiki Hinode, Kyoto (JP); Toru Edo, Kyoto (JP); Kensuke Shinohara, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 384 days.

(21) Appl. No.: 17/605,017

(22) PCT Filed: Apr. 9, 2020

(86) PCT No.: PCT/JP2020/015900
§ 371 (c)(1),
(2) Date: Oct. 20, 2021

(87) PCT Pub. No.: WO2020/241077
PCT Pub. Date: Dec. 3, 2020

(65) Prior Publication Data
US 2022/0238346 A1 Jul. 28, 2022

(30) Foreign Application Priority Data

May 27, 2019 (JP) .................. 2019-098413

(51) Int. Cl.
*H01L 21/306* (2006.01)
*H01L 21/67* (2006.01)
(52) U.S. Cl.
CPC .... *H01L 21/30604* (2013.01); *H01L 21/6708* (2013.01)

(58) Field of Classification Search
CPC .......... H01L 21/30604; H01L 21/6708; H01L 21/67028
See application file for complete search history.

(56) References Cited

U.S. PATENT DOCUMENTS 9,922,850 B2  3/2018  Kwon et al.
2015/0040951 A1  2/2015  Yoshizumi et al.
(Continued)

FOREIGN PATENT DOCUMENTS

CN    106256016 A     12/2016
JP   2009224692 A  *  10/2009
(Continued)

OTHER PUBLICATIONS

International Preliminary Report on Patentability and Written Opinion dated Dec. 9, 2021 in corresponding International Application No. PCT/JP2020/015900 with English translation.
(Continued)

*Primary Examiner* — Binh X Tran
(74) *Attorney, Agent, or Firm* — OSTROLENK FABER LLP

(57) ABSTRACT

In order to improve the quality of a substrate, a substrate processing apparatus includes a substrate holding unit, a first drive unit, a chemical liquid discharge portion, a cup unit, a second drive unit, and a control unit. The substrate holding unit holds a substrate having a first surface and a second surface opposite to the first surface in a horizontal posture. The first drive unit rotates the substrate holding unit about a virtual axis. The chemical liquid discharge portion discharges a chemical liquid toward the first surface of the substrate held by the substrate holding unit. The cup unit surrounds a periphery of the substrate holding unit. The second drive unit changes a relative position in the vertical direction of the cup unit with respect to the substrate holding unit. The control unit, while causing the first drive unit to
(Continued)

rotate the substrate holding unit about the virtual axis and causing the chemical liquid discharge portion to discharge the chemical liquid toward the first surface of the substrate held by the substrate holding unit to execute a chemical liquid treatment of treating the first surface, causes the second drive unit to change the relative position in the vertical direction of the cup unit with respect to the substrate holding unit.

13 Claims, 17 Drawing Sheets

(56) References Cited

U.S. PATENT DOCUMENTS

| | | | |
|---|---|---|---|
| 2017/0047237 | A1 | 2/2017 | Kobata et al. |
| 2018/0025922 | A1* | 1/2018 | Tsujikawa ......... H01L 21/67051 134/26 |
| 2018/0085795 | A1 | 3/2018 | Tsuchihashi et al. |
| 2019/0067045 | A1* | 2/2019 | Hinode ................ B08B 3/041 |

FOREIGN PATENT DOCUMENTS

| | | |
|---|---|---|
| JP | 2015-035474 A | 2/2015 |
| JP | 2018-014353 A | 1/2018 |
| JP | 2018-121024 A | 8/2018 |
| JP | 2019-046892 A | 3/2019 |
| KR | 10-2015-0018383 A | 2/2015 |
| KR | 10-1570168 B1 | 11/2015 |
| KR | 10-1623412 B1 | 6/2016 |
| KR | 10-2018-0009709 A | 1/2018 |
| KR | 10-2018-0034244 A | 4/2018 |
| KR | 10-2019-0024665 A | 3/2019 |
| TW | 201517998 A | 5/2015 |
| TW | 201707132 A | 2/2017 |
| TW | 201913719 A | 4/2019 |

OTHER PUBLICATIONS

Office Action and Search Report dated Mar. 4, 2022 in corresponding Taiwanese Patent Application No. 1091114966 with partial English translation based on the Japanese translation.
Notice of Reasons for Refusal dated Sep. 13, 2022 in corresponding Japanese Patent Application No. 2019-098413 and computer generated English translation obtained from the JPO.
International Search Report mailed Jun. 30, 2020 in corresponding PCT International Application No. PCT/JP2020/015900.
Written Opinion mailed Jun. 30, 2020 in corresponding PCT International Application No. PCT/JP2020/015900.
Request for the Submission of an Opinion dated Nov. 28, 2023 in corresponding Korean Patent Application No. 10-2021-7038796 and a computer generated English translation obtained from the Global Dossier.
Notice of Decision to Grant dated Jun. 28, 2024 in corresponding Korean Patent Application No. 10-2021-7038796.

* cited by examiner

F I G. 1 2
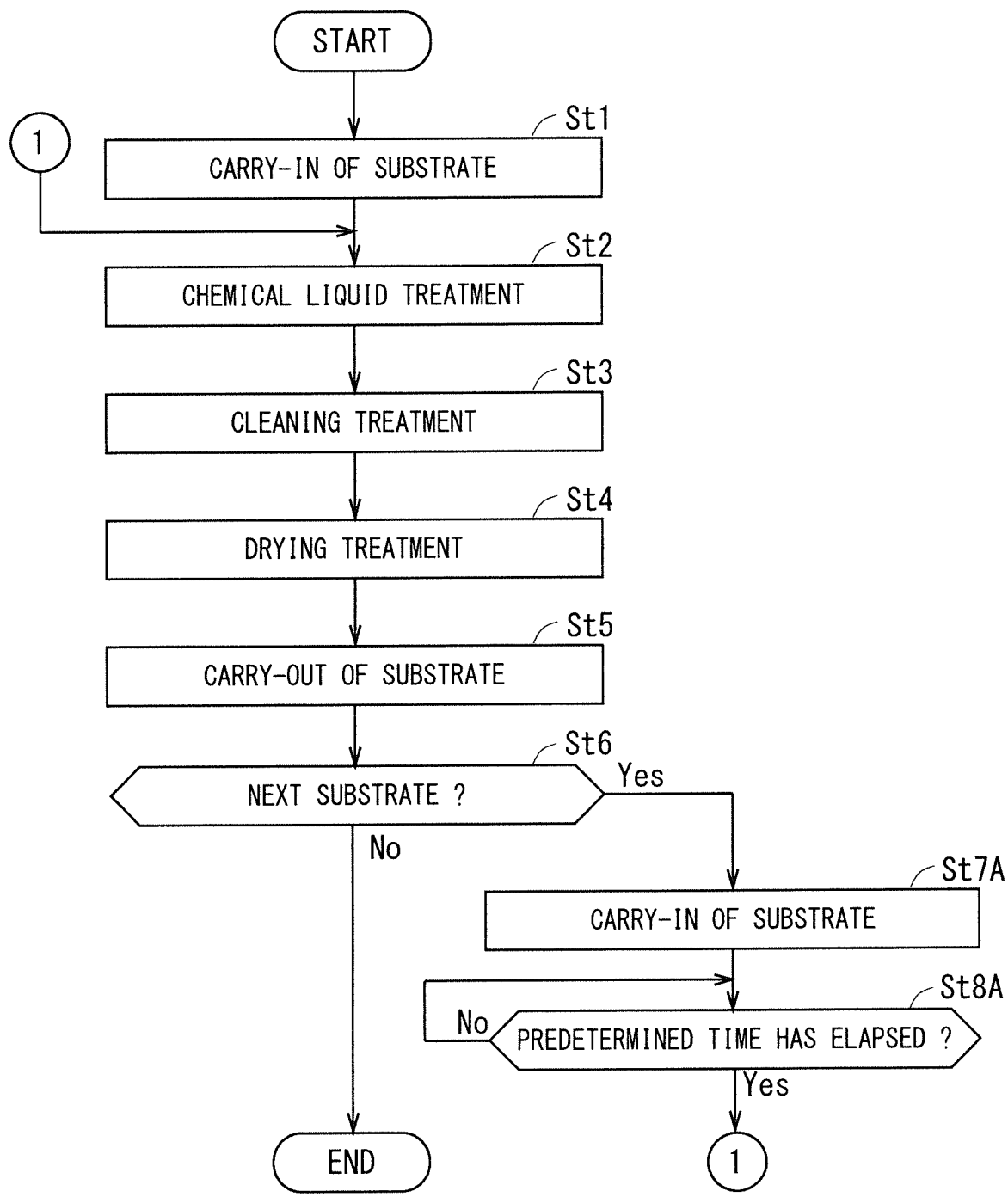

F I G. 1 4
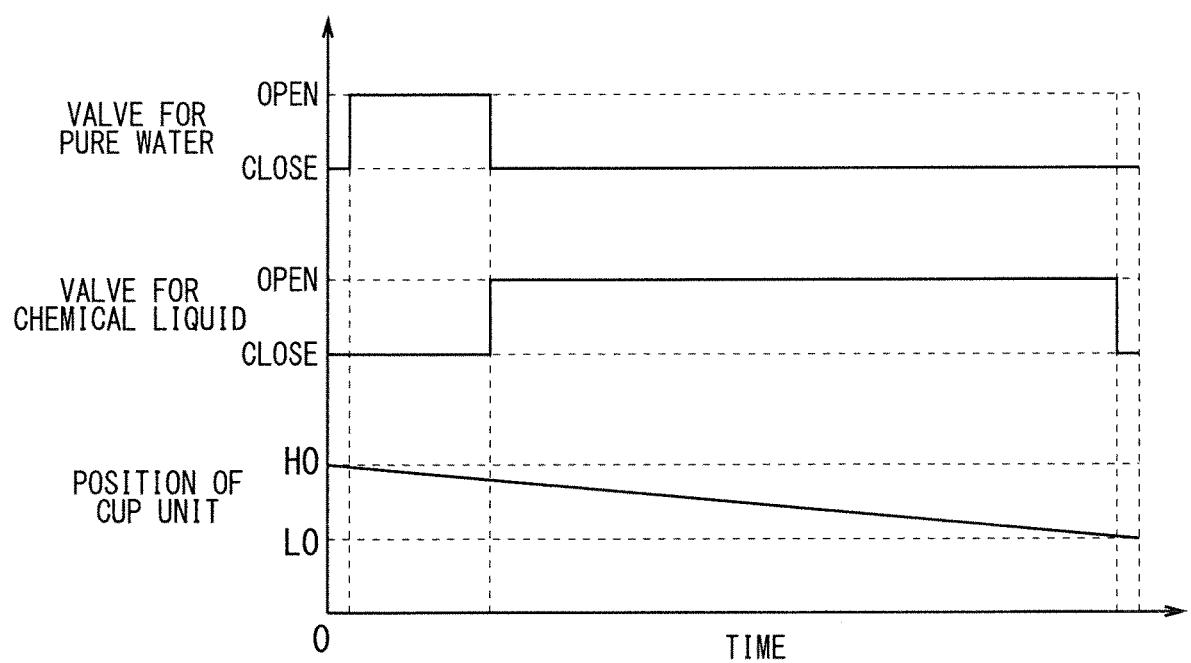

SUBSTRATE PROCESSING APPARATUS, SUBSTRATE PROCESSING METHOD, AND NON-TRANSITORY COMPUTER-READABLE STORAGE MEDIUM

CROSS-REFERENCE TO RELATED APPLICATIONS

The present application is a 35 U.S.C. §§ 371 national phase conversion of International Application No. PCT/JP2020/015900, filed Apr. 9, 2020, which claims priority to Japanese Patent Application No. 2019-098413, filed May 27, 2019, the contents of both of which are incorporated herein by reference. The PCT International Application was published in the Japanese language.

TECHNICAL FIELD

The present invention relates to a technique in which a substrate such as a semiconductor wafer, a substrate for a liquid crystal display, a substrate for a plasma display, a substrate for an organic EL, a substrate for a field emission display (FED), a substrate for an optical display, a substrate for a magnetic disk, a substrate for a magneto-optical disk, a substrate for a photomask, or a substrate for a solar cell is treated with a treatment liquid.

BACKGROUND ART

For example, there is known a substrate processing apparatus that performs various types of treatment on a substrate by sequentially discharging various types of treatment liquid toward the substrate while rotating the substrate about a virtual axis along a vertical direction in a state of holding the substrate in a horizontal posture by a holding unit (for example, Patent Document 1 and the like). Here, the various types of treatment include, for example, etching using a chemical liquid, cleaning using a rinse liquid, and the like.

In such a substrate processing apparatus, for example, a treatment liquid such as a chemical liquid and a rinse liquid scattered from the substrate is received and recovered by a cup provided around the holding unit.

PRIOR ART DOCUMENT

Patent Document

Patent Document 1: Japanese Patent Application Laid-Open No. 2018-121024

SUMMARY

Problem to be Solved by the Invention

However, in the substrate processing apparatus of Patent Document 1 described above, for example, there is a case where a splash in which a large amount of minute droplets splash is generated by collision of droplets scattered from the substrate with droplets adhering to the inner wall surface of the cup. When minute droplets generated here adhere to the substrate, contamination of the surface of the substrate due to adhesion of fine dust, dissolution of the surface of the substrate due to minute droplets of the chemical liquid, and the like occur, and the quality of the substrate may be deteriorated.

The present invention has been made in view of the above problems, and an object thereof is to provide a substrate processing technique capable of improving the quality of a substrate.

Means to Solve the Problem

In order to solve the above problem, a substrate processing apparatus according to a first aspect includes a substrate holding unit, a first drive unit, a chemical liquid discharge portion, a cup unit, a second drive unit, and a control unit. The substrate holding unit holds a substrate having a first surface and a second surface opposite to the first surface in a horizontal posture. The first drive unit rotates the substrate holding unit about a virtual axis. The chemical liquid discharge portion discharges a chemical liquid toward the first surface of the substrate held by the substrate holding unit. The cup unit surrounds a periphery of the substrate holding unit. The second drive unit changes a relative position in the vertical direction of the cup unit with respect to the substrate holding unit. The control unit, while causing the first drive unit to rotate the substrate holding unit about the virtual axis and causing the chemical liquid discharge portion to discharge the chemical liquid toward the first surface of the substrate held by the substrate holding unit to execute a chemical liquid treatment of treating the first surface, causes the second drive unit to change a relative position in the vertical direction of the cup unit with respect to the substrate holding unit.

A substrate processing apparatus according to a second aspect is the substrate processing apparatus according to the first aspect, in which the control unit, in a chemical liquid treatment period from a first timing at which execution of the chemical liquid treatment is started to a second timing at which the execution of the chemical liquid treatment is ended, performs control so as to cause the second drive unit to move a relative position in the vertical direction of the cup unit with respect to the substrate holding unit in a downward direction and not to move it in an upward direction.

A substrate processing apparatus according to a third aspect is the substrate processing apparatus according to the second aspect, in which the control unit, in the chemical liquid treatment period, in order to scatter a droplet of the chemical liquid from the substrate toward a dried portion of an inner wall surface of the cup unit, controls a speed at which the second drive unit moves a relative position in the vertical direction of the cup unit with respect to the substrate holding unit in the downward direction.

A substrate processing apparatus according to a fourth aspect is the substrate processing apparatus according to the second or third aspect, in which the control unit, after the second timing, performs control so as to stop movement of the relative position in the vertical direction of the cup unit with respect to the substrate holding unit in the downward direction by the second drive unit.

A substrate processing apparatus according to a fifth aspect is the substrate processing apparatus according to any one of the second to fourth aspects, in which the control unit, before the first timing, performs control so as to start movement of the relative position in the vertical direction of the cup unit with respect to the substrate holding unit in the downward direction by the second drive unit.

A substrate processing apparatus according to a sixth aspect is the substrate processing apparatus according to the first aspect, in which the control unit, during execution of the chemical liquid treatment, performs control so as to alternately execute a first operation and a second operation. In the first operation, the second drive unit moves a relative position in the vertical direction of the cup unit with respect to the substrate holding unit in a downward direction. In the second operation, the second drive unit moves a relative position in the vertical direction of the cup unit with respect to the substrate holding unit in an upward direction.

A substrate processing apparatus according to a seventh aspect is the substrate processing apparatus according to the sixth aspect, in which the control unit, during execution of the chemical liquid treatment, when causing the second drive unit to execute the second operation, stops discharge of the chemical liquid toward the first surface of the substrate held by the substrate holding unit by the chemical liquid discharge portion.

A substrate processing apparatus according to an eighth aspect is the substrate processing apparatus according to the sixth or seventh aspect, in which the control unit, before causing the second drive unit to stop execution of the first operation and the second operation, stops discharge of the chemical liquid toward the first surface of the substrate held by the substrate holding unit by the chemical liquid discharge portion.

A substrate processing apparatus according to a ninth aspect is the substrate processing apparatus according to any one of the sixth to eighth aspects, in which the control unit, after causing the second drive unit to start execution of the first operation and the second operation, starts discharge of the chemical liquid toward the first surface of the substrate held by the substrate holding unit by the chemical liquid discharge portion.

A substrate processing apparatus according to a tenth aspect is the substrate processing apparatus according to any one of the first to ninth aspects, and includes a cleaning liquid discharge portion that discharges a cleaning liquid toward the first surface of the substrate held by the substrate holding unit. Here, the control unit, after execution of the chemical liquid treatment, while causing the first drive unit to rotate the substrate holding unit about the virtual axis and causing the cleaning liquid discharge portion to discharge the cleaning liquid toward the first surface of the substrate held by the substrate holding unit to execute a cleaning treatment of cleaning the first surface, causes the second drive unit to change a relative position in the vertical direction of the cup unit with respect to the substrate holding unit.

A substrate processing apparatus according to an eleventh aspect is the substrate processing apparatus according to any one of the first to ninth aspects, and includes a cleaning liquid discharge portion that discharges a cleaning liquid toward the first surface of the substrate held by the substrate holding unit, and a gas discharge portion that discharges a gas toward the first surface of the substrate held by the substrate holding unit. Here, the control unit sequentially executes the chemical liquid treatment, a cleaning treatment, and a drying treatment. In the cleaning treatment, while the first drive unit rotates the substrate holding unit about the virtual axis, the cleaning liquid discharge portion discharges the cleaning liquid toward the first surface of the substrate held by the substrate holding unit to clean the first surface. In the drying treatment, while the first drive unit rotates the substrate holding unit about the virtual axis, the gas discharge portion discharges the gas toward the first surface of the substrate held by the substrate holding unit to dry the first surface. Here, the control unit, while executing the drying treatment, causes the second drive unit to change a relative position in the vertical direction of the cup unit with respect to the substrate holding unit.

A substrate processing apparatus according to a twelfth aspect is the substrate processing apparatus according to any one of the first to eleventh aspects, in which the control unit, after completion of execution of the chemical liquid treatment on a first substrate, prohibits start of execution of the chemical liquid treatment on a second substrate next to the first substrate until a preset time required for drying the cup unit elapses.

A substrate processing apparatus according to a thirteenth aspect is the substrate processing apparatus according to any one of the first to twelfth aspects, and includes a protective portion capable of covering the second surface of the substrate held by the substrate holding unit. Here, the control unit, when executing the chemical liquid treatment, causes the protective portion to cover the second surface without discharging liquid onto the second surface.

A substrate processing method according to a fourteenth aspect is a substrate processing method in a substrate processing apparatus, in which the substrate processing apparatus includes a processing unit and a control unit that controls an operation of the processing unit. The processing unit has a substrate holding unit, a first drive unit, a chemical liquid discharge portion, a cup unit, and a second drive unit. The substrate holding unit can hold a substrate having a first surface and a second surface opposite to the first surface in a horizontal posture. The first drive unit can rotate the substrate holding unit about a virtual axis. The chemical liquid discharge portion can discharge a chemical liquid toward the first surface of the substrate held by the substrate holding unit. The cup unit surrounds a periphery of the substrate holding unit. The second drive unit can change a relative position in the vertical direction of the cup unit with respect to the substrate holding unit. The substrate processing method includes a first step and a second step. In the first step, the control unit, while causing the first drive unit to rotate the substrate holding unit about the virtual axis, causes the chemical liquid discharge portion to discharge the chemical liquid toward the first surface of the substrate held by the substrate holding unit to execute a chemical liquid treatment of treating the first surface. In the second step, the control unit, during execution of the chemical liquid treatment in the first step, causes the second drive unit to change a relative position in the vertical direction of the cup unit with respect to the substrate holding unit.

A non-transitory computer-readable storage medium storing a program according to a sixteenth aspect is a computer-readable storage medium in which the program, when executed by a processor of a control unit in a substrate processing apparatus including a processing unit and the control unit that controls an operation of the processing unit, implements a first step and a second step. The processing unit has a substrate holding unit, a first drive unit, a chemical liquid discharge portion, a cup unit, and a second drive unit. The substrate holding unit can hold a substrate having a first surface and a second surface opposite to the first surface in a horizontal posture. The first drive unit can rotate the substrate holding unit about a virtual axis. The chemical liquid discharge portion can discharge a chemical liquid toward the first surface of the substrate held by the substrate holding unit. The cup unit surrounds a periphery of the substrate holding unit. The second drive unit can change a relative position in the vertical direction of the cup unit with respect to the substrate holding unit. In the first step, the control unit, while causing the first drive unit to rotate the substrate holding unit about the virtual axis, causes the chemical liquid discharge portion to discharge the chemical liquid toward the first surface of the substrate held by the substrate holding unit to execute chemical liquid treatment of treating the first surface. In the second step, the control unit, during execution of the chemical liquid treatment in the first step, causes the second drive unit to change a relative position in the vertical direction of the cup unit with respect to the substrate holding unit.

Effects of the Invention

By any of the substrate processing apparatus according to the first to thirteenth aspects, the substrate processing method according to the fourteenth aspect, and the non-transitory computer-readable storage medium according to the sixteenth aspect, for example, when a treatment using a chemical liquid is performed on a substrate, a region that receives droplets of the chemical liquid scattered from the rotating substrate on the inner wall surface of the cup unit moves in the vertical direction. Thus, for example, the droplets of the chemical liquid scattered from the rotating substrate are less likely to collide with droplets adhering to the inner wall surface of the cup unit. As a result, for example, a splash in which a large amount of minute droplets of the chemical liquid splash from the inner wall surface of the cup unit is less likely to occur, and the quality of the substrate can be improved.

According to the substrate processing apparatus according to any one of the second to fifth aspects, for example, when the chemical liquid treatment is executed, the relative position in the vertical direction of the cup unit with respect to the substrate holding unit moves in the downward direction, so that the droplets of the chemical liquid scattered from the rotating substrate are less likely to collide with the droplets adhering to the inner wall surface of the cup unit. Therefore, for example, a splash in which a large amount of minute droplets splash from the inner wall surface of the cup unit is less likely to occur, and the quality of the substrate can be improved.

According to the substrate processing apparatus according to the third aspect, for example, in a dry region of the inner wall surface of the cup unit, even if the chemical liquid scattered from the rotating substrate is received, a splash in which a large amount of minute droplets splash from the inner wall surface of the cup unit is less likely to occur. Therefore, for example, the quality of the substrate can be improved.

According to the substrate processing apparatus according to the fourth aspect, for example, after the scattering of the droplets of the chemical liquid from the rotating substrate toward the cup unit is finished, the movement of the relative position in the vertical direction of the cup unit with respect to the substrate holding unit in the downward direction is stopped. Therefore, for example, the droplets of the chemical liquid scattered from the rotating substrate are less likely to collide with the droplets adhering to the inner wall surface of the cup unit. As a result, for example, a splash in which a large amount of minute droplets splash from the inner wall surface of the cup unit is less likely to occur, and the quality of the substrate can be improved.

According to the substrate processing apparatus according to the fifth aspect, for example, droplets of the chemical liquid scattered from the rotating substrate are less likely to continuously collide with the same portion of the inner wall surface of the cup unit. As a result, for example, a splash in which a large amount of minute droplets splash from the inner wall surface of the cup unit is less likely to occur, and the quality of the substrate can be improved.

According to the substrate processing apparatus according to any one of the sixth to ninth aspects, for example, during execution of the chemical liquid treatment, a region of the inner wall surface of the cup unit that receives the droplets of the chemical liquid scattered from the rotating substrate changes. Therefore, for example, the droplets of the chemical liquid scattered from the rotating substrate are less likely to collide with the droplets adhering to the inner wall surface of the cup unit. As a result, for example, a splash in which a large amount of minute droplets splash from the inner wall surface of the cup unit is less likely to occur, and the quality of the substrate can be improved.

According to the substrate processing apparatus according to the seventh aspect, for example, during execution of the chemical liquid treatment, when the relative position in the vertical direction of the cup unit with respect to the substrate holding unit moves in the upward direction, droplets of the chemical liquid are less likely to scatter from the rotating substrate toward the cup unit. Thus, the droplets of the chemical liquid scattered from the rotating substrate are less likely to collide with the droplets adhering to the inner wall surface of the cup unit. As a result, for example, a splash in which a large amount of minute droplets splash from the inner wall surface of the cup unit is less likely to occur, and the quality of the substrate can be improved.

According to the substrate processing apparatus according to any one of the eighth and ninth aspects, for example, droplets of the chemical liquid scattered from the rotating substrate are less likely to continuously collide with the same portion of the inner wall surface of the cup unit. As a result, for example, a splash in which a large amount of minute droplets splash from the inner wall surface of the cup unit is less likely to occur, and the quality of the substrate can be improved.

According to the substrate processing apparatus according to the tenth aspect, for example, when the substrate is cleaned after the chemical liquid treatment, the droplet of the cleaning liquid scattered from the rotating substrate is received in a wide range of the inner wall surface of the cup unit by changing the relative position in the vertical direction of the cup unit with respect to the substrate holding unit. Therefore, for example, the chemical liquid adhering to the inner wall surface of the cup unit by the chemical liquid treatment can be washed away with the cleaning liquid. Thus, for example, the amount of the chemical liquid adhering to the inner wall surface of the cup unit when the chemical liquid treatment is executed on the next substrate can be reduced. As a result, for example, in the chemical liquid treatment for the next substrate, when the inner wall surface of the cup unit receives the droplets of the chemical liquid scattered from the rotating substrate, the splash in which a large amount of minute droplets splash from the inner wall surface of the cup unit is less likely to occur. Therefore, for example, the quality of the substrate can be improved.

According to the substrate processing apparatus according to the eleventh aspect, for example, when the substrate is subjected to the drying treatment after execution of the chemical liquid treatment and the cleaning treatment on the substrate, the relative position in the vertical direction of the cup unit with respect to the substrate holding unit is changed, so that a gas flowing from above the first surface of the rotating substrate is blown over a wide range of the inner wall surface of the cup unit. Therefore, for example, the inner wall surface of the cup unit can be dried over a wide range. Thus, for example, during execution of the chemical liquid treatment on the next substrate, the drier inner wall surface of the cup unit can receive the droplets of the chemical liquid scattered from the rotating next substrate. As a result, a splash in which a large amount of minute droplets splash from the inner wall surface of the cup unit is less likely to occur, and the quality of the substrate can be improved.

According to the substrate processing apparatus according to the twelfth aspect, for example, by sufficiently drying the cup unit, during execution of the chemical liquid treatment on the next substrate, when the inner wall surface of the cup unit receives the droplets of the chemical liquid scattered from the rotating substrate, a splash in which a large amount of minute droplets splash from the inner wall surface of the cup unit is less likely to occur. Therefore, for example, the quality of the substrate can be improved.

According to the substrate processing apparatus according to the thirteenth aspect, for example, when the second surface is in the dry state and the chemical liquid treatment is executed on the first surface, a splash in which a large amount of minute droplets splash from the inner wall surface of the cup unit is less likely to occur. Therefore, for example, a problem that minute droplets of the chemical liquid adhere to the second surface to be maintained in a dry state and the quality of the second surface is deteriorated is unlikely to occur. As a result, for example, the quality of the substrate can be improved.

BRIEF DESCRIPTION OF DRAWINGS

FIG. 12 is a diagram illustrating an example of a flow of processing using a processing unit according to a first modification.

FIG. 14 is a timing chart illustrating a change in the position of the cup unit at the time of executing a pre-pure water treatment and a chemical liquid treatment according to the second modification.

DESCRIPTION OF EMBODIMENTS

Figure 1:
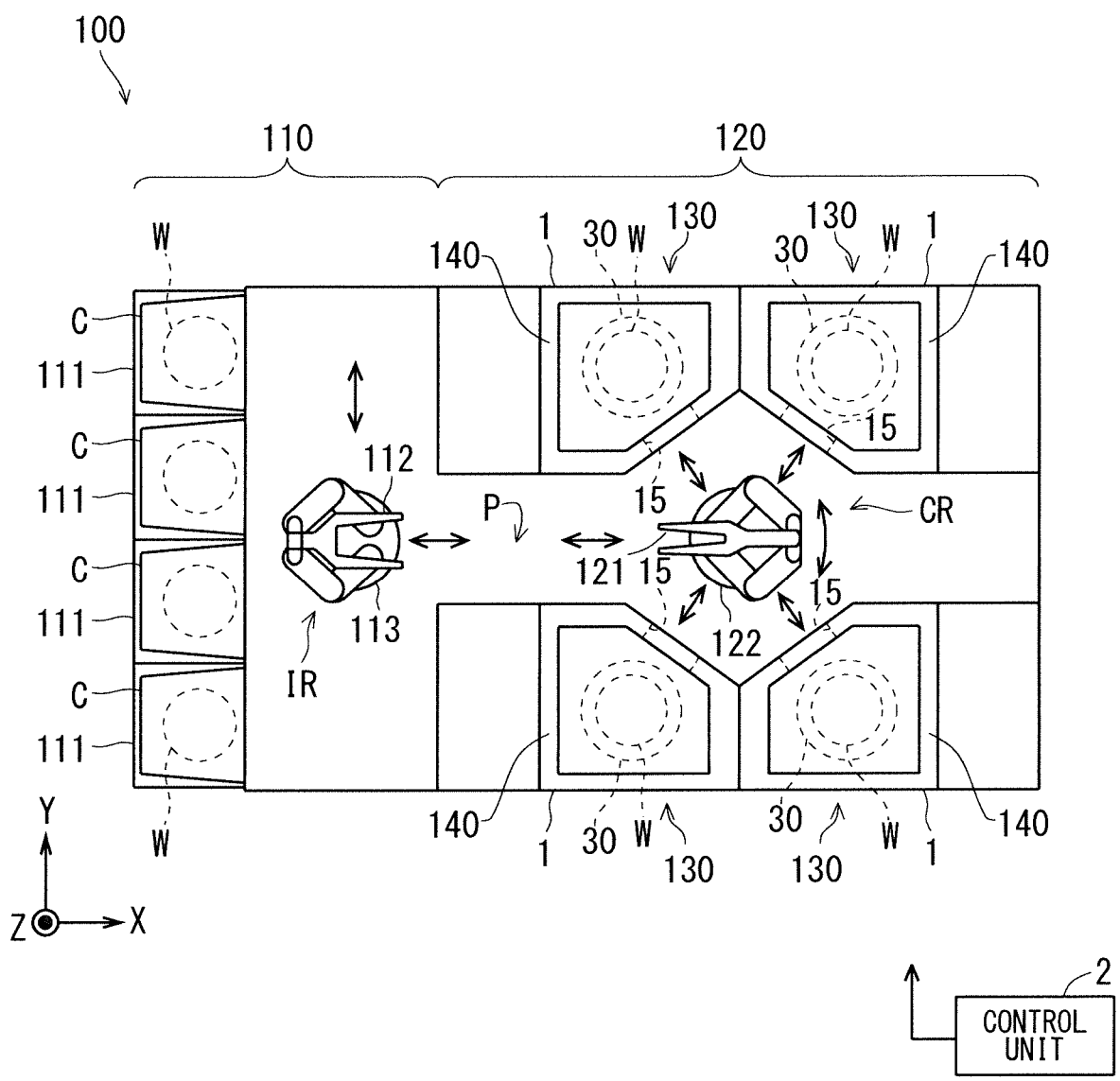
FIG. 1 is a plan view illustrating an example of a schematic configuration of a substrate processing apparatus according to a first embodiment.

Hereinafter, embodiments of the present invention will be described with reference to the accompanying drawings. The components described in each embodiment are merely examples, and are not intended to limit the scope of the present invention only to them. The drawings are only schematically illustrated. In the drawings, the dimensions and the number of parts may be exaggerated or simplified as necessary for easy understanding. In the drawings, portions having similar configurations and functions are denoted by the same reference numerals, and redundant description is appropriately omitted. A right-handed XYZ coordinate system is attached to each of FIGS. 1, 3 to 5, 8A, 8B, 13A, 13B, and 16 to 17B. In this XYZ coordinate system, one direction along the horizontal direction is a +X direction, a direction along the vertical direction (also referred to as a downward direction) is a −Z direction, and a direction orthogonal to both the +X direction and the +Z direction (also referred to as an upward direction) is a +Y direction.

1. First Embodiment

<1-1. Substrate Processing Apparatus>

The configuration of a substrate processing apparatus 100 will be described with reference to FIG. 1.

FIG. 1 is a plan view illustrating an example of a schematic configuration of a substrate processing apparatus 100 according to a first embodiment.

For example, the substrate processing apparatus 100 can continuously perform processing on a plurality of substrates W one by one. In the following description, it is assumed that the substrate W to be processed in the substrate processing apparatus 100 is, for example, a circular semiconductor wafer.

The substrate processing apparatus 100 includes, for example, a plurality of cells (specifically, an indexer cell 110 and a processing cell 120) arranged in parallel, and a control unit 2 that controls respective operation mechanisms and the like included in the plurality of cells (the indexer cell 110 and the processing cell 120).

For example, the indexer cell 110 can deliver an untreated substrate W received from the outside of the apparatus to the processing cell 120 and carry out the treated substrate W received from the processing cell 120 to the outside of the apparatus. The indexer cell 110 includes, for example, carrier stages 111 on which a plurality of carriers C can be placed, and a substrate conveying apparatus (transfer robot) IR capable of carrying the substrate W into and out of each carrier C.

For example, the carrier C storing one or more untreated substrates W can be placed onto the carrier stage 111 from the outside of the substrate processing apparatus 100 by OHT (Overhead Hoist Transfer) or the like. For example, the untreated substrates W can be taken out one by one from the carrier C, treated in the substrate processing apparatus 100, and the treated substrates W treated in the substrate processing apparatus 100 can be stored in the carrier C again. The carrier C storing the treated substrate W can be carried out of the substrate processing apparatus 100 by OHT or the like. As described above, the carrier stage 111 functions as, for example, a substrate accumulating unit capable of accumulating the untreated substrate W and the treated substrate W. Here, the carrier C may be, for example, any of a front opening unified pod (FOUP) that stores the substrate W in a sealed space, a standard mechanical interface (SMIF) pod, and an open cassette (OC) that exposes the stored substrate W to the outside air.

The transfer robot IR includes, for example, a hand 112 capable of holding the substrate W in a horizontal posture (a posture in which the main surface of the substrate W is horizontal) by supporting the substrate W from below, and a hand drive mechanism 113 capable of driving the hand 112. For example, the transfer robot IR can take out the untreated substrate W from the carrier C placed on the carrier stage 111, and deliver the taken out substrate W to a conveyance robot CR described later at a substrate delivery position P. For example, the transfer robot IR can receive the treated substrate W from the conveyance robot CR at the substrate delivery position P, and store the received substrate W in the carrier C placed on the carrier stage 111.

The processing cell 120 can perform processing on the substrate W, for example. The processing cell 120 includes, for example, a plurality of processing units 1 and a substrate conveying apparatus (conveyance robot CR) capable of carrying in and out the substrate W to and from the plurality of processing units 1. Here, for example, a plurality of (for example, three) processing units 1 are stacked in the vertical direction to constitute one processing unit group 130. For example, a plurality of (in the example of FIG. 1, four) processing unit groups 130 are positioned in a cluster shape so as to surround the conveyance robot CR.

Each of the plurality of processing units 1 includes, for example, a processing chamber 140 forming a processing space therein. In the processing chamber 140, for example, a carry-in/out port 15 for inserting a hand 121 of the conveyance robot CR into the processing chamber 140 is formed. Therefore, for example, the processing unit 1 is positioned such that the carry-in/out port 15 faces a space where the conveyance robot CR is disposed. A specific configuration of the processing unit 1 will be described later.

The conveyance robot CR includes, for example, a hand 121 capable of holding the substrate W in a horizontal posture by supporting the substrate W from below, and a hand drive mechanism 122 capable of driving the hand 121. Here, the conveyance robot CR (specifically, the base of the conveyance robot CR) is positioned, for example, substantially at the center of a space surrounded by the plurality of processing unit groups 130. For example, the conveyance robot CR can take out the treated substrate W from the designated processing unit 1 and deliver the taken-out substrate W to the transfer robot IR at the substrate delivery position P. For example, the conveyance robot CR can receive the untreated substrate W from the transfer robot IR at the substrate delivery position P and convey the received substrate W to the designated processing unit 1.

Figure 6:
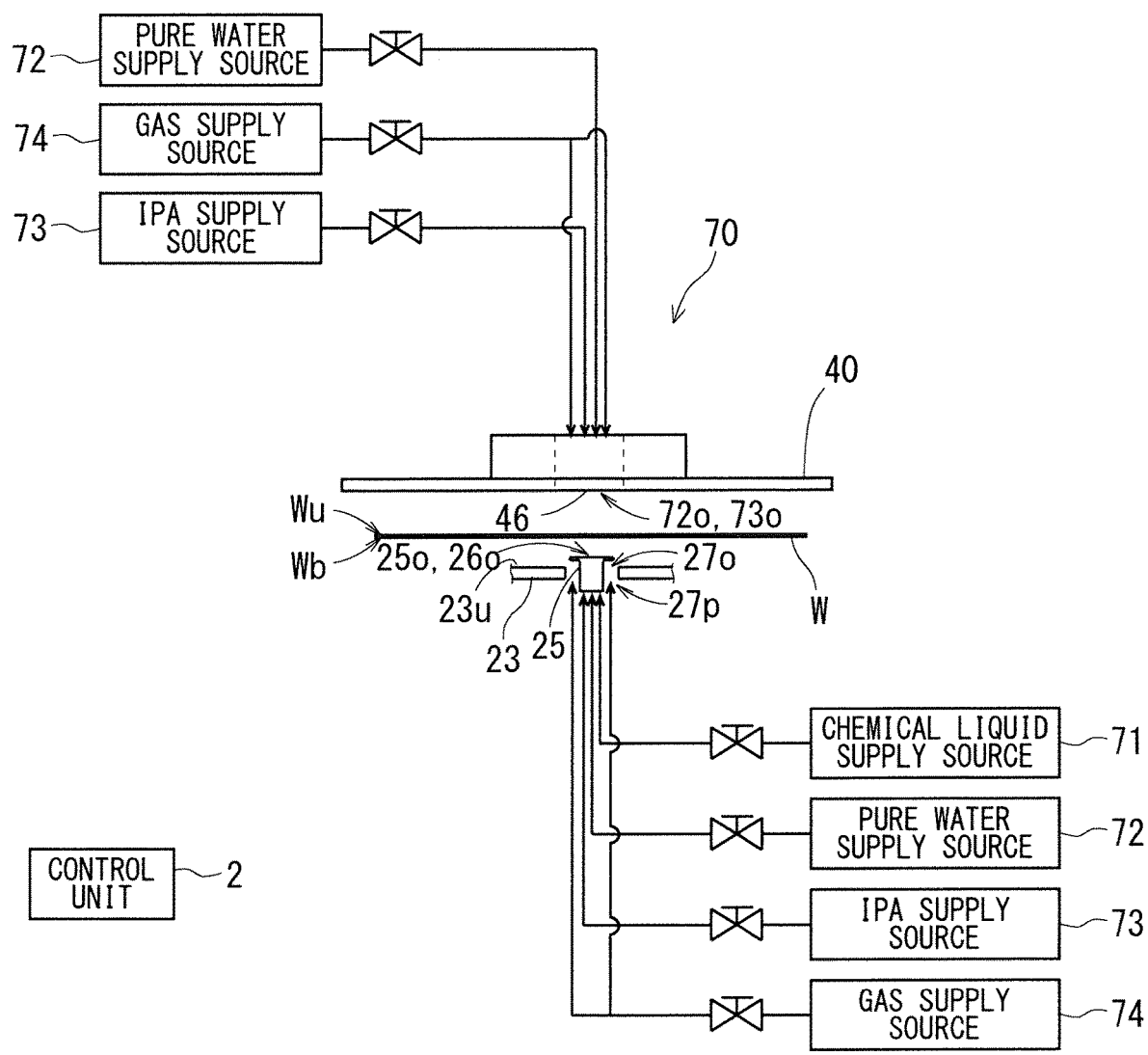
FIG. 6 is a schematic block diagram illustrating an example of a gas-liquid supply portion.

In addition, the substrate processing apparatus 100 has, for example, a configuration for supplying a chemical liquid, pure water, isopropyl alcohol (IPA), and a gas to be used at the time of executing various types of processing in each processing unit 1. For example, the substrate processing apparatus 100 includes a pipe connected to a chemical liquid supply source 71, a valve that opens and closes a flow path of the chemical liquid from the chemical liquid supply source 71 to each processing unit 1, and the like (FIG. 6). The chemical liquid supply source 71 includes, for example, a tank storing a chemical liquid and a mechanism such as a pump for feeding the chemical liquid from the tank. As the chemical liquid, for example, a liquid capable of etching the substrate W, such as a hydrofluoric peroxide mixture (FPM), diluted hydrofluoric acid (DHF), or phosphoric acid, is applied. In addition, for example, the substrate processing apparatus 100 includes a pipe connected to a pure water supply source 72, a valve that opens and closes a flow path of pure water (de-ionized water (DIW)) from the pure water supply source 72 to each processing unit 1, and the like (FIG. 6). The pure water supply source 72 includes, for example, a tank storing pure water and a mechanism such as a pump for feeding pure water from the tank. In addition, for example, the substrate processing apparatus 100 includes a pipe connected to an IPA supply source 73, a valve that opens and closes a flow path of IPA from the IPA supply source 73 to each processing unit 1, and the like (FIG. 6). The IPA supply source 73 includes, for example, a tank storing IPA and a mechanism such as a pump for feeding IPA from the tank. In addition, for example, the substrate processing apparatus 100 includes a pipe connected to a gas supply source 74, a valve that opens and closes a flow path of a gas from the gas supply source 74 to each processing unit 1, and the like (FIG. 6). The gas supply source 74 includes, for example, a tank storing gas and a structure such as a pressure adjustment valve that adjusts the pressure of the gas, and the like. As the gas, for example, an inert gas such as nitrogen ($N_2$) gas is applied. The chemical liquid supply source 71, the pure water supply source 72, the IPA supply source 73, and the gas supply source 74 may be provided in the substrate processing apparatus 100, may be provided in common for the plurality of substrate processing apparatuses 100, or may be installed in a factory in which the substrate processing apparatus 100 is installed.

Figure 2:
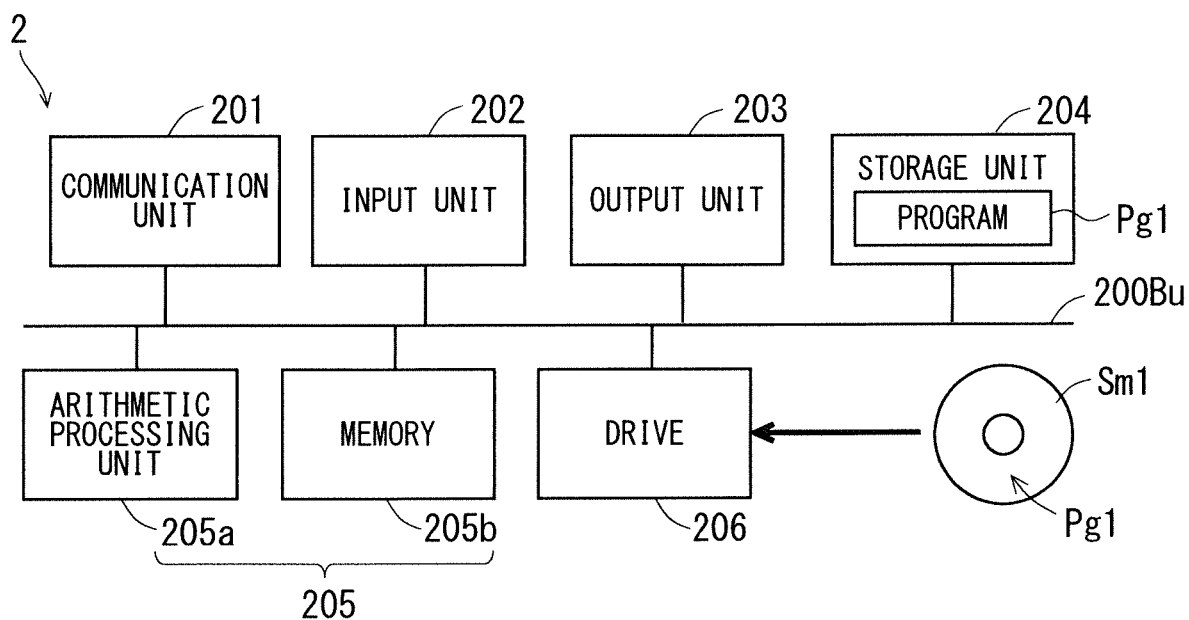
FIG. 2 is a block diagram illustrating a configuration example of a control unit.

For example, the control unit 2 can control the operation of each unit including each processing unit 1 in the substrate processing apparatus 100. FIG. 2 is a block diagram illustrating a configuration example of the control unit 2. The control unit 2 is implemented by, for example, a general computer or the like, and includes a communication unit 201, an input unit 202, an output unit 203, a storage unit 204, a processing unit 205, and a drive 206 which are connected via a bus line 200Bu.

The communication unit 201 can transmit and receive signals to and from each processing unit 1 via a communication line, for example. For example, the communication unit 201 may be able to receive a signal from a management server for managing the substrate processing apparatus 100.

The input unit 202 can input, for example, a signal corresponding to the operation of an operator or the like. The input unit 202 includes, for example, an operation unit such as a mouse and a keyboard capable of inputting a signal corresponding to an operation, a microphone capable of inputting a signal corresponding to a voice, various sensors capable of inputting a signal corresponding to a motion, and the like.

The output unit 203 can output, for example, various types of information in a mode that can be recognized by the operator. The output unit 203 includes, for example, a display unit that visually outputs various types of information, a speaker that audibly outputs various types of information, and the like. The display unit may have a form of, for example, a touch panel integrated with at least a part of the input unit 202.

The storage unit 204 can store, for example, a program Pg1 and various types of information. The storage unit 204 includes, for example, a non-volatile storage medium such as a hard disk or a flash memory. To the storage unit 204, for example, any of a configuration including one storage medium, a configuration integrally including two or more storage media, and a configuration including two or more storage media divided into two or more portions may be applied.

The processing unit 205 includes, for example, an arithmetic processing unit 205a that acts as a processor, a memory 205b that temporarily stores information, and the like. For example, an electronic circuit such as a central processing unit (CPU) is applied to the arithmetic processing unit 205a, and for example, a random access memory (RAM) or the like is applied to the memory 205b. The processing unit 205 can implement the function of the control unit 2, for example, by reading and executing the program Pg1 stored in the storage unit 204. Therefore, the program Pg1 can be executed by, for example, the arithmetic processing unit 205a of the control unit 2. Furthermore, for example, the storage unit 204 including a storage medium storing the program Pg1 can be read by a computer. In the control unit 2, for example, the processing unit 205 performs arithmetic processing according to a procedure described in the program Pg1, thereby implementing various functional units that control the operation of each unit of the substrate processing apparatus 100. That is, the function and operation of the substrate processing apparatus 100 can be implemented by executing the program Pg1 by the control unit 2 included in the substrate processing apparatus 100. Note that some or all of the functional units realized by the control unit 2 may be realized as hardware by, for example, a dedicated logic circuit or the like.

The drive 206 is, for example, a portion to and from which a portable storage medium Sm1 can be attached and detached. The drive 206 can exchange data between the storage medium Sm1 and the processing unit 205 in a state where the storage medium Sm1 is attached, for example. In addition, the drive 206 may be able to read and store the program Pg1 from the storage medium Sm1 into the storage unit 204 in a state where the storage medium Sm1 storing the program Pg1 is attached to the drive 206. Here, the storage medium Sm1 storing the program Pg1 can be read by a computer, for example.

The overall operation of the substrate processing apparatus 100 will be subsequently described with reference to FIG. 1. In the substrate processing apparatus 100, the control unit 2 controls each unit included in the substrate processing apparatus 100 according to a recipe describing a conveyance procedure, processing conditions, and the like of the substrate W, thereby executing a series of operations described below.

When the carrier C storing the untreated substrate W is placed on the carrier stage 111, the transfer robot IR takes out the untreated substrate W from the carrier C. Then, the transfer robot IR moves the hand 112 holding the untreated substrate W to the substrate delivery position P, and delivers the untreated substrate W to the conveyance robot CR at the substrate delivery position P. The conveyance robot CR that has received the untreated substrate W on the hand 121 carries the untreated substrate W into the processing unit 1 designated by the recipe. The delivery of the substrate W between the transfer robot IR and the conveyance robot CR may be directly performed between the hand 112 and the hand 121, for example, or may be performed via a placement portion or the like provided at the substrate delivery position P.

In the processing unit 1 into which the substrate W is carried in, predetermined processing is executed on the substrate W. Details of the processing unit 1 will be described later.

When the processing on the substrate W is completed in the processing unit 1, the conveyance robot CR takes out the treated substrate W from the processing unit 1. Then, the conveyance robot CR moves the hand 121 holding the treated substrate W to the substrate delivery position P, and delivers the treated substrate W to the transfer robot IR at the substrate delivery position P. The transfer robot IR that has received the treated substrate W on the hand 112 stores the treated substrate W in the carrier C.

In the substrate processing apparatus 100, the conveyance robot CR and the transfer robot IR repeatedly perform the above-described conveyance operation according to the recipe, and each processing unit 1 executes processing on the substrate W according to the recipe. As a result, the substrate W is successively treated.

<1-2. Processing Unit>

Figure 3:
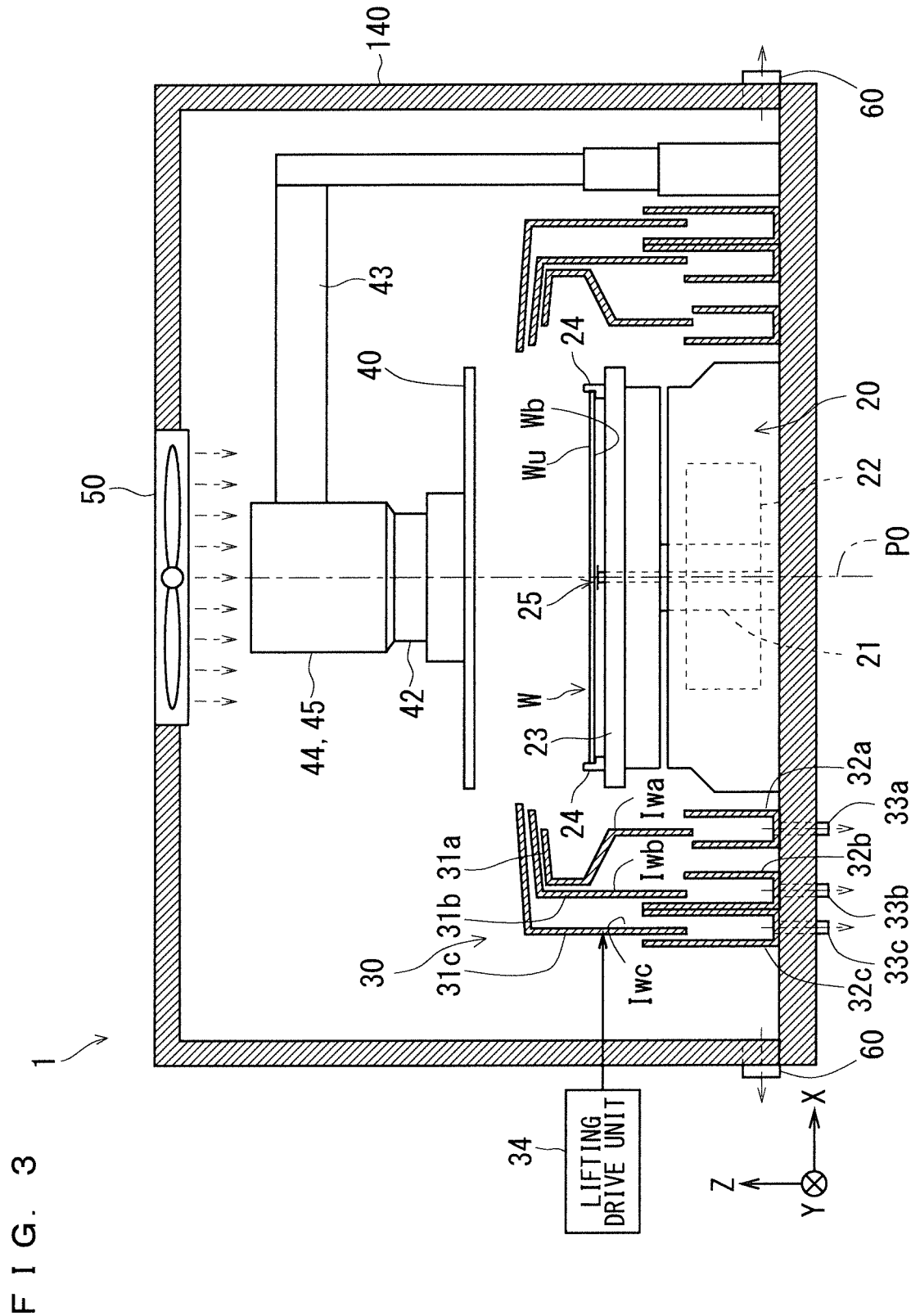
FIG. 3 is a side view schematically illustrating a configuration example of a processing unit.
Figure 4:
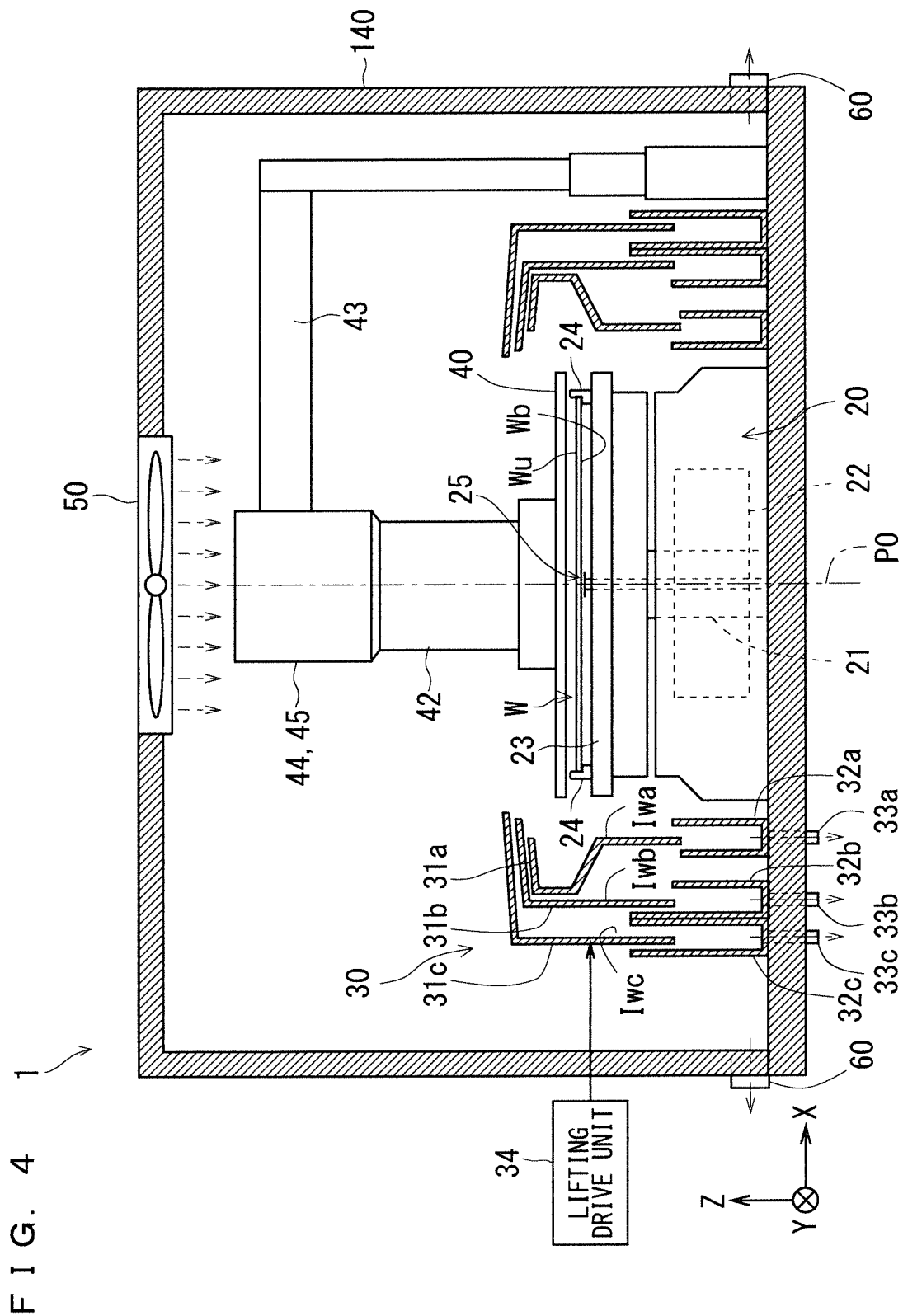
FIG. 4 is a side view schematically illustrating a configuration example of the processing unit.

FIGS. 3 and 4 are side views each schematically illustrating a configuration example of the processing unit 1. The processing unit 1 is, for example, a single wafer processing unit capable of executing a series of substrate processing of sequentially performing etching for removing a thin film exposed from a resist on a lower surface (also referred to as a back surface) Wb of a substrate W such as a semiconductor wafer by corrosion, cleaning of the substrate W, and drying of the substrate W.

The processing unit 1 includes, for example, a spin chuck 20 that holds and rotates the substrate W in a substantially horizontal posture. The spin chuck 20 includes, for example, a central shaft 21, a rotation mechanism 22, a spin base 23, and a plurality of chuck pins 24. The central shaft 21 is a rod-shaped member having a longitudinal direction along the vertical direction and a perfectly circular cross section. The rotation mechanism 22 is a portion (also referred to as a first drive unit) that generates a driving force such as a motor for rotating the central shaft 21. The spin base 23 is a disk-shaped member in a substantially horizontal posture, and the substantially center of the lower surface of the spin base 23 is fixed to the upper end portion of the central shaft 21 with a fastening component such as a screw. The plurality of chuck pins 24 are, for example, erected near the peripheral edge portion on the upper surface side of the spin base 23, and are portions (also referred to as substrate holding units) capable of holding the substrate W by gripping the peripheral edge portion of the substrate W. Specifically, for example, the plurality of chuck pins 24 can hold the substrate W having a lower surface Wb as the first surface and an upper surface Wu as the second surface opposite to the lower surface Wb in the horizontal posture. In other words, the substrate W is held by the spin chuck 20 with the upper surface Wu facing upward. For example, three or more chuck pins 24 may be provided in order to reliably hold the circular substrate W, and are arranged at equal angular intervals along the peripheral edge portion of the spin base 23. Each of the chuck pins 24 has a portion (also referred to as a substrate support portion) that supports the peripheral edge portion of the substrate W from below, and a portion (also referred to as a substrate gripping portion) that presses the outer peripheral end surface of the substrate W supported by the substrate support portion to hold the substrate W. In addition, each of the chuck pins 24 is configured to be switchable between a pressed state in which the substrate gripping portion presses the outer peripheral end surface of the substrate W and a released state in which the substrate gripping portion is separated from the outer peripheral end surface of the substrate W. Here, when the conveyance robot CR delivers the substrate W to the spin base 23, each of the chuck pins 24 is in the released state, and when the substrate processing is performed on the substrate W, each of the chuck pins 24 is in the pressed state. When each of the chuck pins 24 is in the pressed state, each of the chuck pins 24 grips the peripheral edge portion of the substrate W, and the substrate W is held in a substantially horizontal posture with a predetermined interval from the spin base 23. Here, for example, when the central shaft 21 is rotated by the rotation mechanism 22 in response to an operation command from the control unit 2, the spin base 23 fixed to the central shaft 21 rotates about a virtual axis (also referred to as a virtual axis) P0 extending along the vertical direction. That is, the rotation mechanism 22 can rotate the spin base 23 and the plurality of chuck pins 24 about the virtual axis P0. As a result, for example, the substrate W held in a substantially horizontal posture by the plurality of chuck pins 24 can be rotated about the virtual axis P0.

Figure 5:
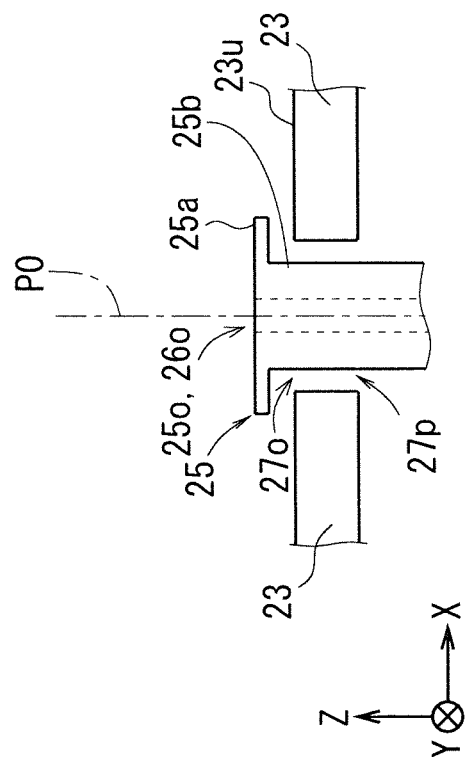
FIG. 5 is an enlarged view illustrating an example of a cross section of a lower supply portion and a portion in the vicinity of the lower supply portion.

In addition, the processing unit 1 includes, for example, a lower supply portion 25 at a substantially central portion of the upper surface of the spin base 23. FIG. 5 is an enlarged view illustrating an example of a cross section of the lower supply portion 25 and a portion in the vicinity thereof. The lower supply portion 25 includes, for example, a substantially columnar main body portion 25b centered on the virtual axis P0, and a substantially annular plate-shaped eaves portion 25a extending outward in the radial direction of the virtual axis P0 from the upper end portion of the main body portion 25b. The main body portion 25b is inserted into, for example, a substantially columnar through hole formed to penetrate the central portion of the spin base 23 in the vertical direction. For example, a first discharge portion 25o and a second discharge portion 26o are provided substantially at the central portion of the upper end surface of the main body portion 25b. An opening (also referred to as a discharge port) or the like capable of discharging liquid can be applied to the first discharge portion 25o and the second discharge portion 26o. A flow path (also referred to as a lower annular flow path) 27p through which a gas passes is formed between the side surface of the main body portion 25b and the inner peripheral surface of the through hole of the spin base 23. An annular third discharge portion 27o capable of discharging the gas from the lower annular flow path 27p is formed between the upper surface 23u of the spin base 23 and the main body portion 25b. The eaves portion 25a is spaced upward from the upper surface 23u of the spin base 23 and is positioned so as to extend outward in the radial direction of the virtual axis P0 along the upper surface 23u. The lower surface of the eaves portion 25a is substantially parallel to the upper surface 23u.

In addition, the processing unit 1 includes, for example, a blocking member 40 disposed above the spin chuck 20. The blocking member 40 is, for example, a disk-shaped member. The lower surface of the blocking member 40 is a surface (also referred to as a substrate facing surface) facing substantially parallel to the upper surface Wu of the substrate W, and has a size equal to or larger than the diameter of the substrate W. The blocking member 40 is attached substantially horizontally to the lower end portion of a support shaft 42 having a substantially cylindrical shape, for example. The support shaft 42 is held rotatably about a vertical axis passing through the center of the substrate W via a rotation mechanism 44 and a lifting mechanism 45 by an arm 43 extending in the horizontal direction, for example. The rotation mechanism 44 can rotate the support shaft 42 about a vertical axis passing through the center of the substrate W in response to an operation command from the control unit 2, for example. In addition, for example, the control unit 2 can control the operation of the rotation mechanism 44 to rotate the blocking member 40 in the same rotation direction and at substantially the same rotation speed as the substrate W corresponding to the rotation of the substrate W held by the spin chuck 20. For example, the lifting mechanism 45 can dispose the blocking member 40 at a position close to the spin base or a position separated from the spin base 23 in response to an operation command from the control unit 2. For example, by controlling the operation of the lifting mechanism 45, the control unit 2 can raise the blocking member 40 to the separated position above the spin chuck 20 (position shown in FIG. 3) when carrying the substrate W into and from the processing unit 1, and can lower the blocking member 40 to the proximity position (position shown in FIG. 4) in the immediate vicinity of the upper surface Wu of the substrate W held by the spin chuck 20 when predetermined substrate processing is performed on the substrate W in the processing unit 1. Here, the blocking member 40 functions as a portion (also referred to as a protective portion) capable of covering the upper surface Wu of the substrate W held by the spin chuck 20 by being lowered to the proximity position.

FIG. 6 is a schematic block diagram illustrating an example of a gas-liquid supply portion 70 included in the processing unit 1. The gas-liquid supply portion 70 includes, for example, the lower supply portion 25 provided in a substantially central portion of the spin base 23. The lower supply portion 25 includes the first discharge portion 25o, the second discharge portion 26o, and the third discharge portion 27o. The gas-liquid supply portion 70 includes, for example, an upper supply portion 46 provided in a substantially central portion of the lower surface of the blocking member 40. The upper supply portion 46 includes, for example, a fourth discharge portion 72o. The upper supply portion 46 may include, for example, a fifth discharge portion 73o.

The lower supply portion 25 is connected to, for example, the chemical liquid supply source 71, the pure water supply source 72, and the IPA supply source 73 via each valve. Here, for example, by selectively opening and closing each valve in response to an operation command from the control unit 2, it is possible to selectively supply the chemical liquid, pure water, or IPA from the chemical liquid supply source 71, the pure water supply source 72, and the IPA supply source 73 toward the lower supply portion 25. Then, for example, the chemical liquid supplied from the chemical liquid supply source 71 to the lower supply portion 25 passes through a flow path penetrating the lower supply portion 25, and is discharged from the first discharge portion 25o provided in the upper portion of the lower supply portion 25 toward the lower surface Wb of the substrate W. In other words, the first discharge portion 25o as the chemical liquid discharge portion can discharge the chemical liquid toward the lower surface Wb as the first surface of the substrate W held by the plurality of chuck pins 24 as the substrate holding unit. Therefore, in response to the operation signal from the control unit 2, while rotating the spin base 23 and the plurality of chuck pins 24 about the virtual axis P0 by the rotation mechanism 22, it is possible to perform processing (also referred to as chemical liquid treatment) of discharging the chemical liquid toward the lower surface Wb of the substrate W held by the plurality of chuck pins 24 by the first discharge portion 25o and performing processing on the lower surface Wb. In addition, the liquid for cleaning (also referred to as a cleaning liquid) such as pure water or IPA supplied from the pure water supply source 72 or the IPA supply source 73 to the lower supply portion 25 passes through a flow path penetrating the lower supply portion 25, and is discharged from the second discharge portion 26o as a cleaning liquid discharge portion provided in the upper portion of the lower supply portion 25 toward the lower surface Wb of the substrate W held by the spin chuck 20. Therefore, for example, in response to the operation signal from the control unit 2, while rotating the spin base 23 and the plurality of chuck pins 24 about the virtual axis P0 by the rotation mechanism 22, it is possible to perform processing (also referred to as a cleaning treatment) of cleaning the lower surface Wb by discharging the cleaning liquid such as pure water or IPA toward the lower surface Wb of the substrate W held by the plurality of chuck pins 24 by the second discharge portion 26o.

The lower annular flow path 27p of the lower supply portion 25 is connected to the gas supply source 74 via, for example, a valve. Here, for example, by opening and closing the valve in response to an operation command from the control unit 2, it is possible to supply gas (inert gas such as nitrogen gas, for example) from the gas supply source 74 toward the lower annular flow path 27p. Then, the gas supplied from the gas supply source 74 to the lower annular flow path 27p is discharged from the annular third discharge portion 27o as a gas discharge portion toward the lower surface Wb of the substrate W held by the spin chuck 20. Therefore, for example, in response to the operation signal from the control unit 2, while rotating the spin base 23 and the plurality of chuck pins 24 about the virtual axis P0 by the rotation mechanism 22, it is possible to perform processing (also referred to as a drying treatment) of drying the lower surface Wb by discharging the gas toward the lower surface Wb of the substrate W held by the plurality of chuck pins 24 by the third discharge portion 27o.

The upper supply portion 46 is connected to the gas supply source 74 via, for example, a valve. Here, by opening and closing the valve in response to an operation command from the control unit 2, it is possible to supply gas (inert gas such as nitrogen gas, for example) from the gas supply source 74 toward the upper supply portion 46. Then, the gas supplied from the gas supply source 74 to the upper supply portion 46 is discharged from the fourth discharge portion 72o toward the upper surface Wu of the substrate W. Therefore, for example, in response to an operation signal from the control unit 2, in a state in which the blocking member 40 is disposed at a proximity position in the immediate vicinity of the upper surface Wu of the substrate W held by the spin chuck 20 (also referred to as a proximity state), while rotating the spin base 23 and the plurality of chuck pins 24 about the virtual axis P0 by the rotation mechanism 22, it is possible to perform processing of maintaining a state in which the upper surface Wu is dried (also referred to as a dry state) or a drying treatment of drying the upper surface Wu by discharging gas toward the upper surface Wu of the substrate W held by the plurality of chuck pins 24 by the fourth discharge portion 72o. At this time, for example, the gas discharged from the fourth discharge part 72o in the gap between the blocking member 40 and the upper surface Wu of the substrate W flows toward the peripheral edge of the substrate W.

In addition, the upper supply portion 46 may be connected to the pure water supply source 72 and the IPA supply source 73 via each valve, for example. In this case, for example, by selectively opening and closing each valve in response to an operation command from the control unit 2, it is possible to selectively supply pure water or IPA from the pure water supply source 72 and the IPA supply source 73 toward the upper supply portion 46. Then, the pure water or IPA supplied from the pure water supply source 72 or the IPA supply source 73 to the upper supply portion 46 passes through a flow path penetrating the upper supply portion 46, and is discharged from the fifth discharge portion 73o provided below the upper supply portion 46 toward the upper surface Wu of the substrate W. Therefore, for example, in response to an operation signal from the control unit 2, in a proximity state in which the blocking member 40 is disposed at a proximity position in the immediate vicinity of the upper surface Wu of the substrate W held by the spin chuck 20, while rotating the spin base 23 and the plurality of chuck pins 24 about the virtual axis P0 by the rotation mechanism 22, it is possible to execute a cleaning treatment of cleaning the upper surface Wu by discharging a cleaning liquid such as pure water or IPA toward the upper surface Wu of the substrate W held by the plurality of chuck pins 24 by the fifth discharge portion 73o.

In addition, the processing unit 1 includes, for example, a cup unit 30 disposed to surround the periphery of the spin chuck 20. The cup unit 30 includes, for example, a plurality of cup members that can be moved up and down independently of each other by a lifting drive unit 34. Specifically, the cup unit 30 includes, for example, an inner cup member 31a, a middle cup member 31b, and an outer cup member 31c. For example, various mechanisms such as a ball screw mechanism or an air cylinder can be applied to the lifting drive unit 34. As a result, the lifting drive unit 34, for example, functions as a portion (also referred to as a second drive unit) capable of changing the relative position in the vertical direction of each of the inner cup member 31a, the middle cup member 31b, and the outer cup member 31c with respect to the spin chuck 20 in response to an operation command from the control unit 2.

For example, the inner cup member 31a surrounds the periphery of the spin chuck 20 and has a shape that is substantially rotationally symmetric with respect to the virtual axis P0 passing through the center of the substrate W held by the spin chuck 20. The inner cup member 31a includes, for example, a side wall portion having a cylindrical shape centered on the virtual axis P0, and an upper inclined portion having an annular shape centered on the virtual axis P0 and extending obliquely upward from an upper end portion of the side wall portion so as to approach the virtual axis P0. In addition, for example, the middle cup member 31b further surrounds the outer peripheral portion of the inner cup member 31a positioned so as to surround the periphery of the spin chuck 20, and has a shape that is substantially rotationally symmetric with respect to the virtual axis P0 passing through the center of the substrate W held by the spin chuck 20. The middle cup member 31b includes, for example, a side wall portion having a cylindrical shape centered on the virtual axis P0 and an upper inclined portion having an annular shape centered on the virtual axis P0 and extending obliquely upward from an upper end portion of the side wall portion so as to approach the virtual axis P0. In addition, for example, the outer cup member 31c further surrounds the outer peripheral portions of the inner cup member 31a and the middle cup member 31b positioned so as to sequentially surround the periphery of the spin chuck 20, and has a shape that is substantially rotationally symmetric with respect to the virtual axis P0 passing through the center of the substrate W held by the spin chuck 20. The outer cup member 31c includes, for example, a side wall portion having a cylindrical shape centered on the virtual axis P0, and an upper inclined portion having an annular shape centered on the virtual axis P0 and extending obliquely upward from an upper end portion of the side wall portion so as to approach the virtual axis P0.

Here, for example, when the inner cup member 31a is positioned so as to surround the spin base 23 and the plurality of chuck pins 24 from the side, the liquid discharged toward the substrate W held and rotated by the spin chuck 20 scatters toward the inner cup member 31a and is received by a wall surface (also referred to as an inner wall surface) Iwa of the inner cup member 31a on the virtual axis P0 side. The liquid received by the inner cup member 31a flows down along the inner wall surface Iwa of the inner cup member 31a, for example, and is collected through a first drainage tank 32a and a first drainage port 33a. Further, for example, when the inner cup member 31a is lowered to the lowermost portion and the middle cup member 31b is positioned so as to surround the spin base 23 and the plurality of chuck pins 24 from the side, the liquid discharged toward the substrate W held and rotated by the spin chuck 20 scatters toward the middle cup member 31b and is received by a wall surface (also referred to as an inner wall surface) Iwb of the middle cup member 31b on the virtual axis P0 side. The liquid received by the middle cup member 31b flows down along the inner wall surface Iwb of the middle cup member 31b, for example, and is collected through a second drainage tank 32b and a second drainage port 33b. Further, for example, when each of the inner cup member 31a and the middle cup member 31b is lowered to the lowermost portion and the outer cup member 31c is positioned so as to surround the spin base 23 and the plurality of chuck pins 24 from the side, the liquid discharged toward the substrate W held and rotated by the spin chuck 20 scatters toward the outer cup member 31c and is received by a wall surface (also referred to as an inner wall surface) Iwc of the outer cup member 31c on the virtual axis P0 side. The liquid received by the outer cup member 31c flows down along the inner wall surface Iwc of the outer cup member 31c, for example, and is collected through a third drainage tank 32c and a third drainage port 33c.

The processing unit 1 also includes, for example, a fan filter unit (FFU) 50. The FFU 50 can further clean an air in a clean room where the substrate processing apparatus 100 is installed and supply the air to a space in the processing chamber 140. The FFU 50 is attached to, for example, a ceiling wall of the processing chamber 140. The FFU 50 is equipped with fans and filters (e.g., HEPA filters) for taking in air within the clean room and feeding the air into the processing chamber 140 and can form a clean air downflow in the processing space within the processing chamber 140. In order to uniformly disperse the clean air supplied from the FFU 50 in the processing chamber 140, a punching plate provided with a large number of blow-out holes may be disposed immediately below the ceiling wall. In addition, in a part of the side wall of the processing chamber 140 and in the vicinity of the floor wall of the processing chamber, for example, an exhaust duct 60 connected to communicate with the exhaust mechanism is provided. As a result, for example, of the clean air supplied from the FFU 50 and flowing down in the processing chamber 140, the air passing through the vicinity of the cup unit 30 and the like can be discharged to the outside of the apparatus through the exhaust duct 60.

<1-3. Processing Using Processing Unit>

Figure 7:
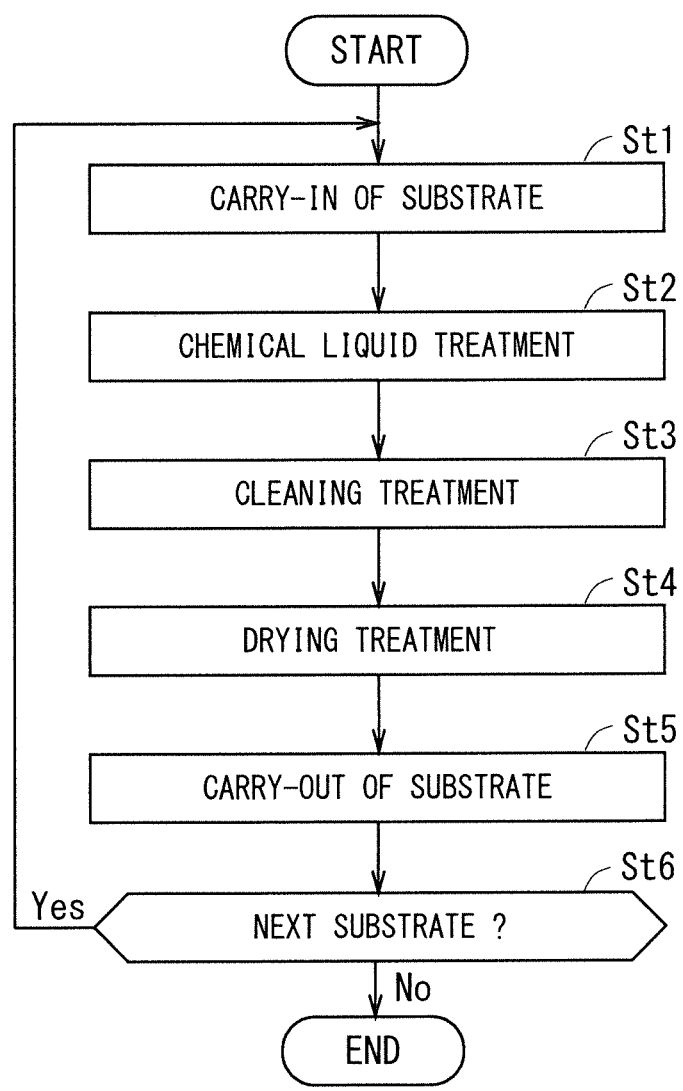
FIG. 7 is a diagram illustrating an example of a flow of processing using the processing unit.

FIG. 7 is a diagram illustrating an example of a flow of processing using the processing unit 1. The flow of the processing is realized by controlling the operation of each unit by the control unit 2. At this time, the program Pg1 can be executed by, for example, a processor included in the processing unit 205 of the control unit 2. Here, description will be given focusing on one processing unit 1 of the substrate processing apparatus 100.

In the substrate processing apparatus 100, first, by the conveyance robot CR, an untreated substrate W is carried into the processing unit 1 via the carry-in/out port 15 of the processing chamber 140 (step SU). At this time, the untreated substrate W is held in a substantially horizontal posture by the plurality of chuck pins 24. Here, it is assumed that the untreated substrate W is in a state in which at least a part of the thin film is exposed on the upper surface Wu and a part of the thin film is exposed from the resist on the lower surface Wb. As the material of the thin film, for example, a material having conductivity such as copper is applied.

Next, chemical liquid treatment is executed on the lower surface Wb of the substrate W in the processing unit 1 (step St2). Here, first, the blocking member 40 is lowered to a proximity position in the immediate vicinity of the upper surface Wu of the substrate W held by the spin chuck 20. Thereafter, a step (also referred to as a first step) is performed in which the control unit 2, while causing the rotation mechanism 22 to rotate the spin base 23 and the plurality of chuck pins 24 about the virtual axis P0, causes the first discharge portion 25o to discharge a chemical liquid toward the lower surface Wb of the substrate W held by the plurality of chuck pins 24 to execute a chemical liquid treatment of treating the lower surface Wb. At this time, for example, in order to maintain the upper surface Wu in a dry state, the fourth discharge portion 72o discharges an inert gas such as nitrogen gas toward the upper surface Wu of the substrate W. In addition, the control unit 2 causes the lifting drive unit 34 to execute a step (also referred to as a second step) of changing the relative position in the vertical direction of the cup unit 30 with respect to the spin chuck 20 during execution of chemical liquid treatment in the first step. As a result, for example, when the chemical liquid treatment is applied to the substrate W, a region of the inner wall surface of the cup unit 30 that receives droplets of the chemical liquid scattered from the rotating substrate W moves in the vertical direction. Therefore, for example, the droplets of the chemical liquid scattered from the rotating substrate W is less likely to collide with the droplets adhering to the inner wall surface of the cup unit 30. As a result, for example, a splash in which a large amount of minute droplets of the chemical liquid splash from the inner wall surface of the cup unit 30 is less likely to occur, and the minute droplets of the chemical liquid are less likely to reach the upper surface Wu of the substrate W. Therefore, for example, contamination of the upper surface Wu of the substrate W and a defect in which an unintended treatment is applied to the upper surface Wu of the substrate W hardly occur, and the quality of the substrate W can be improved. A specific operation example at the time of executing the chemical liquid treatment will be described later.

After the chemical liquid treatment is executed, the processing unit 1 executes a cleaning treatment on the lower surface Wb of the substrate W (step St3). Here, for example, the control unit 2, while causing the rotation mechanism 22 to rotate the spin base 23 and the plurality of chuck pins 24 about the virtual axis P0, causes the second discharge portion 26o to discharge a cleaning liquid (pure water or the like) toward the lower surface Wb of the substrate W held by the plurality of chuck pins 24, thereby executing a cleaning treatment of cleaning the lower surface Wb. As a result, the chemical liquid, particles, and the like adhering to the lower surface Wb of the substrate W are removed. Here, for example, the control unit 2, while executing the cleaning treatment, may cause the lifting drive unit 34 to change the relative position in the vertical direction of the cup unit 30 with respect to the spin chuck 20. In this case, for example, in a wide range of the inner wall surface of the cup unit 30, droplets of the cleaning liquid scattered from the rotating substrate W are received. Therefore, the chemical liquid adhering to the inner wall surface of the cup unit 30 by the chemical liquid treatment can be washed away with the cleaning liquid. As a result, for example, it is possible to reduce the amount of the chemical liquid adhering to the inner wall surface of the cup unit 30 until the chemical liquid treatment is executed on the next substrate W. As a result, for example, during execution of the chemical liquid treatment on the next substrate W, when the inner wall surface of the cup unit 30 receives the droplets of the chemical liquid scattered from the rotating next substrate W, a splash in which a large amount of minute droplets of the chemical liquid splash from the inner wall surface of the cup unit 30 is less likely to occur, and the quality of the substrate W can be improved. Note that, for example, in parallel with the cleaning treatment on the lower surface Wb of the substrate W, the cleaning treatment may be performed on the upper surface Wu of the substrate W by discharging the cleaning liquid from the fifth discharge portion 73o toward the upper surface Wu of the substrate W. A specific operation example at the time of executing the cleaning treatment will be described later.

After the above cleaning treatment, a drying treatment is executed on the lower surface Wb of the substrate W in the processing unit 1 (step St4). Here, for example, the control unit 2, while causing the rotation mechanism 22 to rotate the spin base 23 and the plurality of chuck pins 24 about the virtual axis P0, causes the third discharge portion 270 to discharge gas toward the lower surface Wb of the substrate W held by the plurality of chuck pins 24, thereby executing a drying treatment of drying the lower surface Wb. As a result, the treatment liquid or the like adhering to the lower surface Wb of the substrate W is removed, and the lower surface Wb of the substrate W is dried. Here, for example, the control unit 2, while executing the drying treatment, may cause the lifting drive unit 34 to change the relative position in the vertical direction of the cup unit 30 with respect to the spin chuck 20. In this case, for example, in a wide range of the inner wall surface of the cup unit 30, gas flowing along the lower surface Wb of the rotating substrate W is blown. At this time, for example, the gas flowing along the path drawn by the two-dot chain line arrow Dp0 (FIGS. 8A and 8B) is blown onto the inner wall surface of the cup unit 30. Therefore, for example, the inner wall surface of the cup unit 30 can be dried over a wide range. As a result, for example, when chemical liquid treatment is executed on the next substrate W, droplets of the chemical liquid scattered from the rotating substrate W can be received by the more dried inner wall surface of the cup unit 30. As a result, a splash in which a large amount of minute droplets of the chemical liquid splash from the inner wall surface of the cup unit 30 is less likely to occur, and the quality of the substrate W can be improved. Note that, for example, in parallel with the drying treatment on the lower surface Wb of the substrate W, the drying treatment may be performed on the upper surface Wu of the substrate W by discharging the gas from the fourth discharge portion 720 toward the upper surface Wu of the substrate W. A specific operation example at the time of executing the drying treatment will be described later.

Next, the conveyance robot CR carries the treated substrate W out of the processing unit 1 through the carry-in/out port 15 of the processing chamber 140 (step St5).

Then, the control unit 2, for example, with reference to a recipe or the like, determines whether or not a next substrate W to be processed in the processing unit 1 is present (step St6). Here, if an untreated substrate W as a next processing target in the processing unit 1 is present, the process returns to step St1, and if no untreated substrate W as a next treatment target in the processing unit 1 is present, a series of processing using the processing unit 1 is terminated.

<1-3-1. Specific Operation Example at the Time of Executing Chemical Liquid Treatment>

Figure 8A:
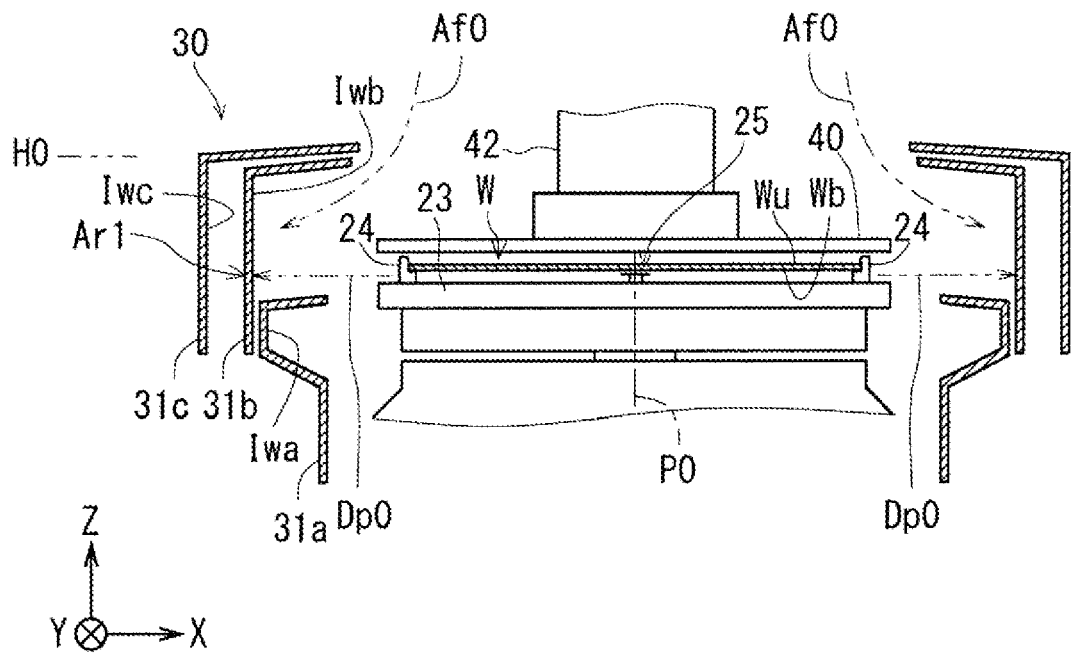
FIGS. 8A and 8B are views schematically illustrating a change in a position of a cup unit at the time of executing substrate processing.
Figure 8B:
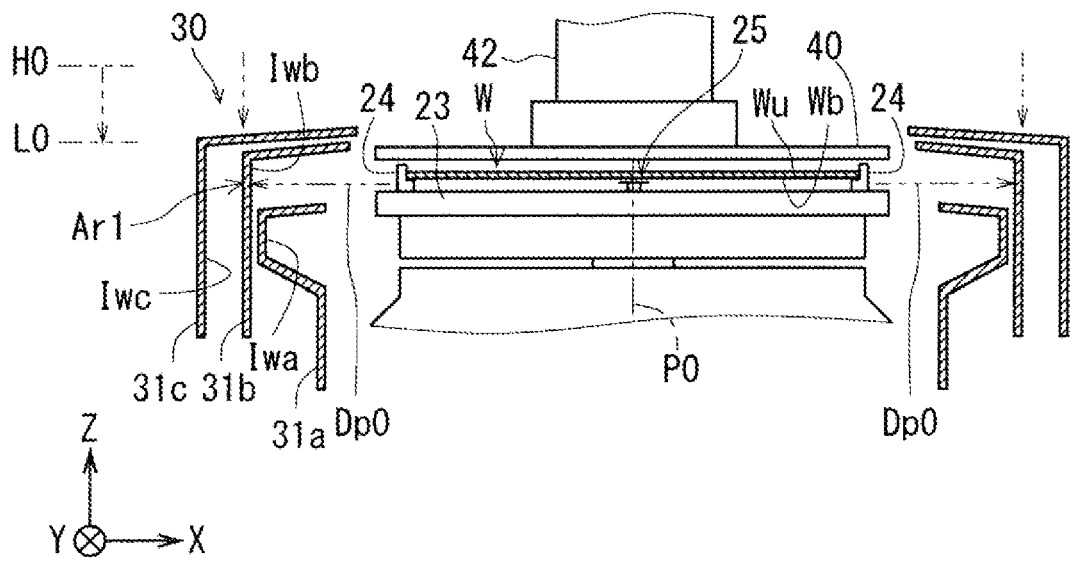

FIGS. 8A and 8B are views schematically illustrating a change in the position in the vertical direction of the cup unit 30 at the time of executing the substrate processing. In the examples of FIGS. 8A and 8B, in a state where the inner cup member 31a is lowered to the lowermost portion, the middle cup member 31b and the outer cup member 31c are moved between a raised predetermined first position H0 and a lowered predetermined second position L0. FIG. 8A illustrates a state in which the middle cup member 31b and the outer cup member 31c are raised to a predetermined first position H0, and FIG. 8B illustrates a state in which the middle cup member 31b and the outer cup member 31c are lowered to a predetermined second position L0. In addition, in FIGS. 8A and 8B, a path in which a droplet of a chemical liquid or the like discharged toward the lower surface Wb of the substrate W is scattered toward the cup unit 30 by the rotation of the substrate W about the virtual axis P0 by the spin chuck 20 is drawn by an arrow Dp0 of a two-dot chain line. Specifically, a state in which a droplet of a chemical liquid or the like discharged toward the lower surface Wb of the substrate W is scattered toward a region (also referred to as a liquid receiving region) Ar1 of the inner wall surface Iwb of the middle cup member 31b is illustrated. Further, in FIG. 8A, an example of a downflow path of clean air from the FFU 50 toward the inside (specifically, the inner wall surface Iwb of the middle cup member 31b) of the cup unit 30 is drawn by a two-dot chain line arrow Af0.

Figure 9A:
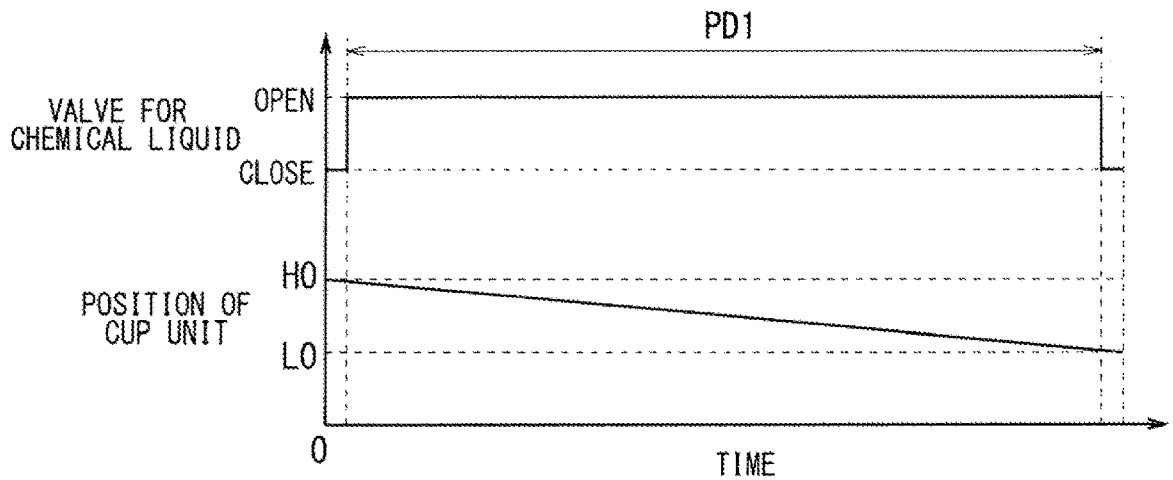
FIGS. 9A to 9C are timing charts each illustrating a change in the position of the cup unit at the time of executing a chemical liquid treatment.
Figure 9B:
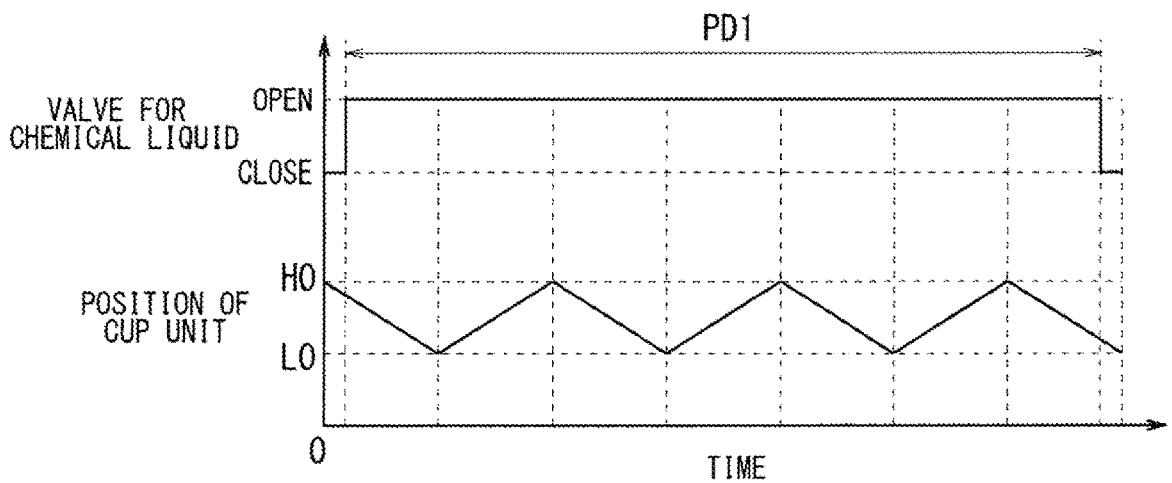
Figure 9C:
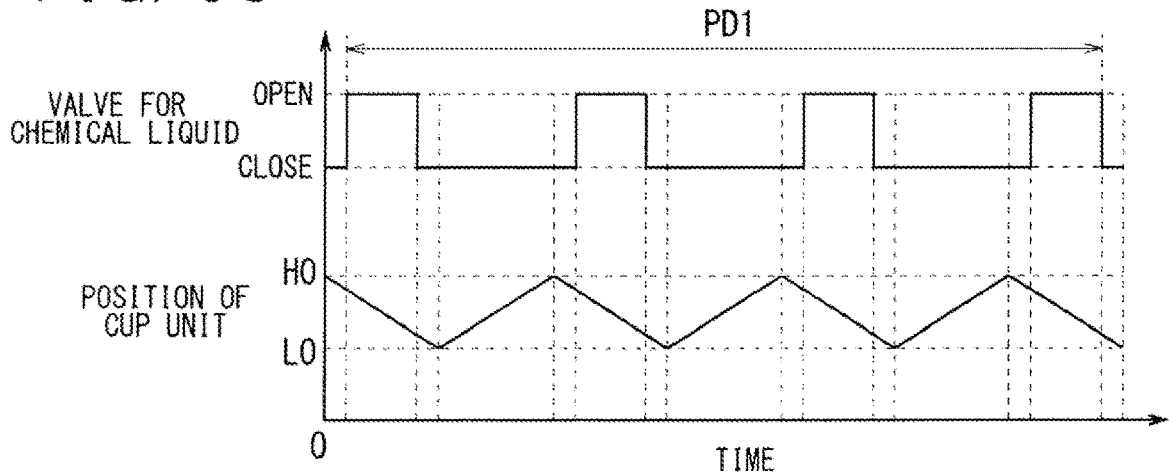

FIGS. 9A to 9C are timing charts each illustrating a change in the position in the vertical direction of the cup unit 30 at the time of executing the chemical liquid treatment. Each of FIGS. 9A to 9C illustrates a change over time in the opening and closing of a valve (also referred to as a valve for a chemical liquid) for supplying a chemical liquid from the chemical liquid supply source 71 to the lower supply portion 25, and in the position in the vertical direction of the cup unit 30 (specifically, the middle cup member 31b).

Here, for example, as illustrated in FIG. 9A, in a period (also referred to as a chemical liquid treatment period) PD1 from a first timing at which the valve for the chemical liquid is opened to start execution of the chemical liquid treatment to a second timing at which the valve for the chemical liquid is closed to end the execution of the chemical liquid treatment, an aspect is conceivable in which the control unit 2 performs control so as to cause the lifting drive unit 34 to move the relative position in the vertical direction of the cup unit 30 (specifically, the middle cup member 31b) with respect to the spin chuck 20 downward and not to move the relative position upward. When such an aspect is adopted, in the examples of FIGS. 8A and 8B, the liquid receiving region Ar1 on the inner wall surface Iwb moves upward with the lapse of time. Therefore, for example, when the inner wall surface Iwb is in a dry state before the start of the chemical liquid treatment, the droplets of the chemical liquid scattered from the rotating substrate W hardly collide with the droplets adhering to the inner wall surface Iwb. As a result, for example, a splash in which a large amount of minute droplets of the chemical liquid splash from the inner wall surface Iwb is less likely to occur, and the minute droplets of the chemical liquid are less likely to reach the upper surface Wu of the substrate W. As a result, for example, contamination of the upper surface Wu of the substrate W and a defect in which an unintended treatment is applied to the upper surface Wu of the substrate W hardly occur, and the quality of the substrate W can be improved.

Here, for example, the control unit 2, in the chemical liquid treatment period PD1, in order to scatter the droplets of the chemical liquid from the substrate W toward the dried portion of the inner wall surface Iwb, may control the speed at which the lifting drive unit 34 moves the relative position in the vertical direction of the cup unit 30 (specifically, the middle cup member 31b) with respect to the spin chuck 20 in the downward direction. The speed of such movement may be obtained in advance by, for example, an experiment using an apparatus having a configuration equivalent to that of the processing unit 1, or may be obtained in advance by a simulation according to the configuration of the processing unit 1. When such a configuration is adopted, for example, in a dry region of the inner wall surface Iwb, even if droplets of the chemical liquid scattered from the rotating substrate W are received, a splash in which a large amount of minute droplets splash from the inner wall surface Iwb is less likely to occur, and the quality of the substrate W can be improved.

In addition, here, for example, if the control unit 2, when executing the chemical liquid treatment, causes the blocking member 40 to cover the upper surface Wu without causing the upper supply portion 46 to discharge liquid onto the upper surface Wu, a problem that minute droplets of the chemical liquid adhere to the upper surface Wu to be maintained in a dry state and the quality of the upper surface Wu deteriorates is unlikely to occur. Here, for example, an aspect is conceivable in which the control unit 2 causes the blocking member 40 to cover the upper surface Wu without causing the fifth discharge portion 73o to discharge the cleaning liquid such as pure water or IPA to the upper surface Wu. Then, at this time, for example, even if a large droplet of the chemical liquid bounces off the inner wall surface Iwb, in order to prevent the large droplet of the chemical liquid from reaching the upper surface Wu of the substrate W, the upper surface Wu can be protected by the presence of the blocking member 40 and the flow of the inert gas from the fourth discharge portion 72o in the gap between the blocking member 40 and the upper surface Wu of the substrate W. As a result, for example, contamination of the upper surface Wu of the substrate W and a defect in which an unintended treatment is applied to the upper surface Wu of the substrate W hardly occur, and the quality of the substrate W can be improved.

In addition, here, as in the example of FIG. 9A, after the second timing at which the chemical liquid treatment period PD1 ends, the control unit 2 may perform control to stop the downward movement of the relative position in the vertical direction of the cup unit 30 (specifically, the middle cup member 31b) with respect to the spin chuck 20 by the lifting drive unit 34. As described above, for example, after the scattering of the droplets of the chemical liquid from the rotating substrate W is completed, if the downward movement of the relative position in the vertical direction of the cup unit 30 (specifically, the middle cup member 31b) with respect to the spin chuck 20 is stopped, the droplets of the chemical liquid scattered from the rotating substrate W is less likely to collide with the droplets adhering to the inner wall surface Iwb. As a result, for example, a splash in which a large amount of minute droplets of the chemical liquid splash from the inner wall surface Iwb is less likely to occur, and the quality of the substrate W can be improved.

In addition, here, as in the example of FIG. 9A, before the first timing at which the chemical liquid treatment period PD1 is started, the control unit 2 may perform control to start the downward movement of the relative position in the vertical direction of the cup unit 30 (specifically, the middle cup member 31b) with respect to the spin chuck 20 by the lifting drive unit 34. According to such control, for example, droplets of the chemical liquid scattered from the rotating substrate W are less likely to continuously collide with the same portion of the inner wall surface (specifically, the inner wall surface Iwb of the middle cup member 31b) of the cup unit 30. As a result, for example, a splash in which a large amount of minute droplets of the chemical liquid splash from the inner wall surface Iwb is less likely to occur, and the quality of the substrate W can be improved.

By the way, for example, in a case where the chemical liquid treatment period PD1 is a relatively long time such as several 10 seconds or more, as shown in FIG. 9B, the control unit 2, during the execution of the chemical liquid treatment, may cause the lifting drive unit 34 to alternately perform an operation (also referred to as a first operation) of moving the relative position in the vertical direction of the cup unit 30 (specifically, the middle cup member 31b) with respect to the spin chuck 20 in the downward direction and an operation (also referred to as a second operation) of moving the relative position in the vertical direction of the cup unit 30 (specifically, the middle cup member 31b) with respect to the spin chuck 20 in the upward direction. According to such an operation, for example, during the execution of the chemical liquid treatment, it is possible to change the liquid receiving region Ar1 that receives the droplets of the chemical liquid scattered from the rotating substrate W on the inner wall surface Iwb. At this time, for example, as compared with a case where the liquid receiving region Ar1 on the inner wall surface Iwb does not change, the droplets of the chemical liquid scattered from the rotating substrate W are less likely to collide with the droplets adhering to the inner wall surface Iwb. Further, for example, when the second operation is performed, even if droplets of the chemical liquid scattered from the rotating substrate W collide with the film-like chemical liquid flowing down on the inner wall surface Iwb, a splash in which a large amount of minute droplets of the chemical liquid splash is less likely to occur.

In addition, at this time, for example, if the liquid receiving region Ar1 on the inner wall surface Iwb is lowered by the second operation, a wide region above the liquid receiving region Ar1 in the inner wall surface Iwb can be dried by the downflow of the clean air whose path is drawn by the arrow Af0 or the like. Therefore, in the next first operation, in a relatively dry region of the inner wall surface Iwb, droplets of the chemical liquid scattered from the rotating substrate W are easily received. As a result, a splash in which a large amount of minute droplets of the chemical liquid splash from the inner wall surface Iwb is less likely to occur. Further, at this time, for example, when the middle cup member 31b moves toward the predetermined first position H0 by the second operation, as illustrated in FIG. 8A, the downflow of the clean air whose path is drawn by the arrow Af0 easily flows toward the inner wall surface Iwb. For this reason, for example, even if a splash in which a large amount of minute droplets of the chemical liquid splash on the inner wall surface Iwb occurs, the minute droplets are less likely to fly up due to the downflow of the clean air whose path is drawn by the arrow Af0. Furthermore, for example, even if a splash in which a large amount of minute droplets of the chemical liquid splash on the inner wall surface Iwb occurs, the downflow of the clean air in the processing chamber 140 generates a flow toward the outer peripheral direction of the blocking member 40 on the upper surface side of the blocking member 40 so that the minute droplets of the chemical liquid are less likely to reach the upper surface Wu of the substrate W. As a result, contamination of the upper surface Wu of the substrate W and a defect in which an unintended treatment is applied to the upper surface Wu of the substrate W hardly occur.

Here, as in the example of FIG. 9B, if the control unit 2, before stopping the execution of the first operation and the second operation by the lifting drive unit 34, causes the first discharge portion 250 to stop the discharge of the chemical liquid toward the lower surface Wb of the substrate W held by the spin chuck 20, droplets of the chemical liquid scattered from the rotating substrate W are less likely to continuously collide with the same portion of the inner wall surface Iwb. As a result, for example, a splash in which a large amount of minute droplets of the chemical liquid splash from the inner wall surface Iwb is less likely to occur, and the quality of the substrate W can be improved. Further, here, as in the example of FIG. 9B, if the control unit 2, after starting the execution of the first operation and the second operation by the lifting drive unit 34, causes the first discharge portion 250 to start the discharge of the chemical liquid toward the lower surface Wb of the substrate W held by the spin chuck 20, droplets of the chemical liquid scattered from the rotating substrate W are less likely to continuously collide with the same portion of the inner wall surface Iwb. As a result, for example, a splash in which a large amount of minute droplets of the chemical liquid splash from the inner wall surface Iwb is less likely to occur, and the quality of the substrate W can be improved.

In addition, for example, if the control unit 2 causes the lifting drive unit 34 to quickly execute switching between the first operation and the second operation, the time during which droplets of the chemical liquid scattered from the rotating substrate W continuously collide with the same portion of the inner wall surface Iwb is shortened. As a result, for example, a splash in which a large amount of minute droplets of the chemical liquid splash from the inner wall surface Iwb is less likely to occur, and the quality of the substrate W can be improved.

Furthermore, here, for example, as in the example of FIG. 9C, when the control unit 2, during the execution of the chemical liquid treatment, causes the lifting drive unit 34 to execute the second operation, the control unit 2 may stop the discharge of the chemical liquid toward the lower surface Wb of the substrate W held by the spin chuck 20 by the first discharge portion 250. When such a configuration is adopted, for example, the droplets of the chemical liquid scattered from the rotating substrate W hardly collide with the droplets adhering to the inner wall surface Iwb. As a result, for example, a splash in which a large amount of minute droplets of the chemical liquid splash from the inner wall surface Iwb is less likely to occur, and the quality of the substrate W can be improved.

<1-3-2. Specific Operation Example when Cleaning Treatment is Executed>

Figure 10A:
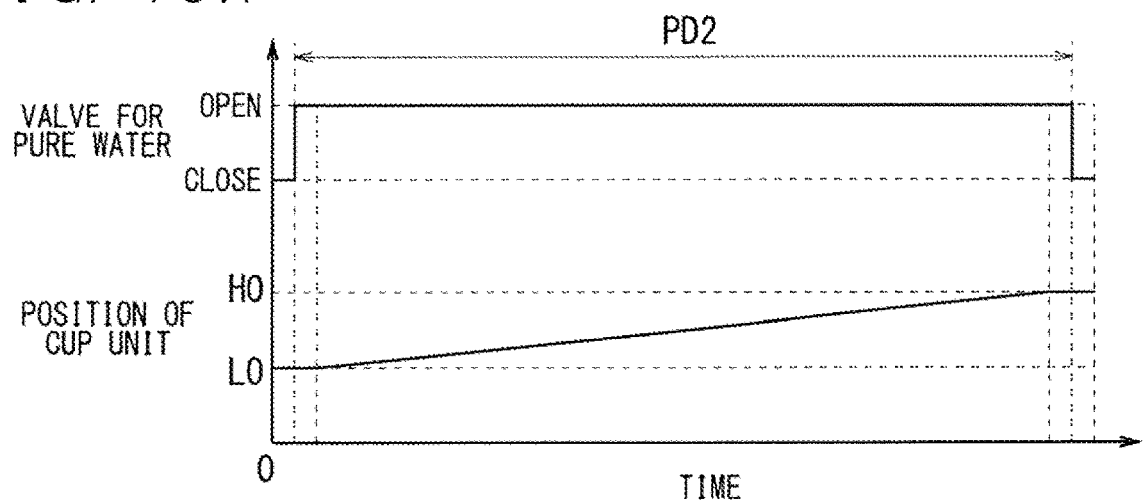
FIGS. 10A and 10B are timing charts each illustrating a change in the position of the cup unit at the time of executing a cleaning treatment.
Figure 10B:
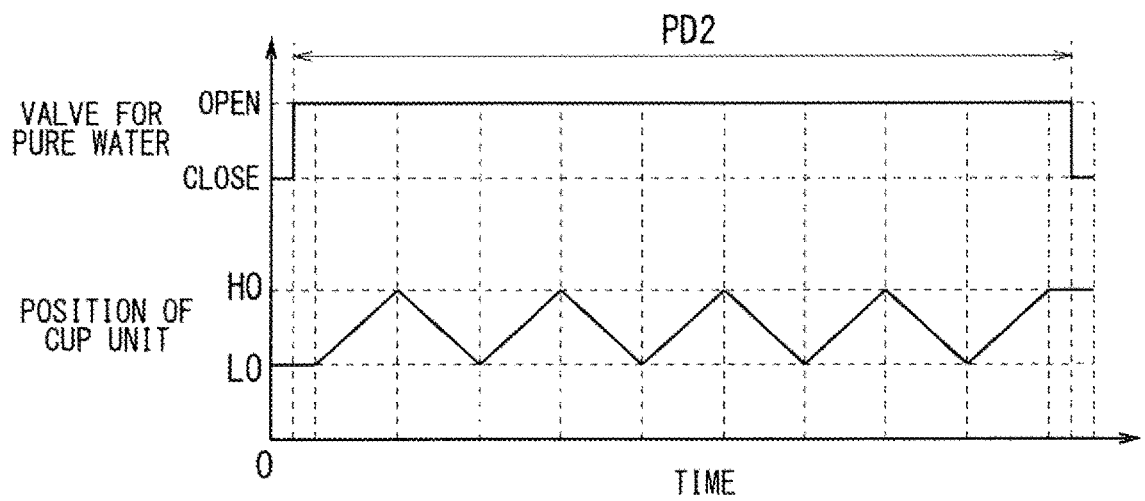

FIGS. 10A and 10B are timing charts each illustrating a change in the position in the vertical direction of the cup unit 30 at the time of executing the cleaning treatment. Each of FIGS. 10A and 10B shows a change over time in the opening and closing of a valve (also referred to as a valve for pure water) for supplying pure water from the pure water supply source 72 to the lower supply portion 25, and in the position in the vertical direction of the cup unit 30 (specifically, the middle cup member 31b).

Here, for example, as shown in FIG. 10A, in a period (also referred to as a cleaning treatment period) PD2 from a timing at which the valve for pure water is opened to start the execution of the cleaning treatment to a timing at which the valve for pure water is closed to end the execution of the cleaning treatment, an aspect is conceivable in which the control unit 2 performs control to cause the lifting drive unit 34 to move the relative position in the vertical direction of the cup unit 30 (specifically, the middle cup member 31b) with respect to the spin chuck 20 in the upward direction. Here, as in the example of FIG. 10A, the control unit 2, after starting the execution of the cleaning treatment, may start the movement of the relative position in the vertical direction of the cup unit 30 (specifically, the middle cup member 31b) with respect to the spin chuck 20 by the lifting drive unit 34. In addition, the control unit 2, before ending the execution of the cleaning treatment, may end the movement of the relative position in the vertical direction of the cup unit 30 (specifically, the middle cup member 31b) with respect to the spin chuck 20 by the lifting drive unit 34. As a result, for example, in the chemical liquid adhering to the inner wall surface of the cup unit 30 by the chemical liquid treatment, a portion not washed out by the cleaning liquid is less likely to be generated. As a result, it is possible to reduce the amount of the chemical liquid adhering to the inner wall surface of the cup unit 30 until the chemical liquid treatment is executed on the next substrate W.

In addition, as shown in FIG. 10B, the control unit 2, during the execution of the cleaning treatment, may cause the lifting drive unit 34 to alternately execute the first operation of moving the relative position in the vertical direction of the cup unit 30 (specifically, the middle cup member 31b) with respect to the spin chuck 20 in the downward direction and the second operation of moving the relative position in the vertical direction of the cup unit 30 (specifically, the middle cup member 31b) with respect to the spin chuck 20 in the upward direction.

<1-3-3. Specific Operation Example when Drying Treatment is Executed>

Figure 11A:
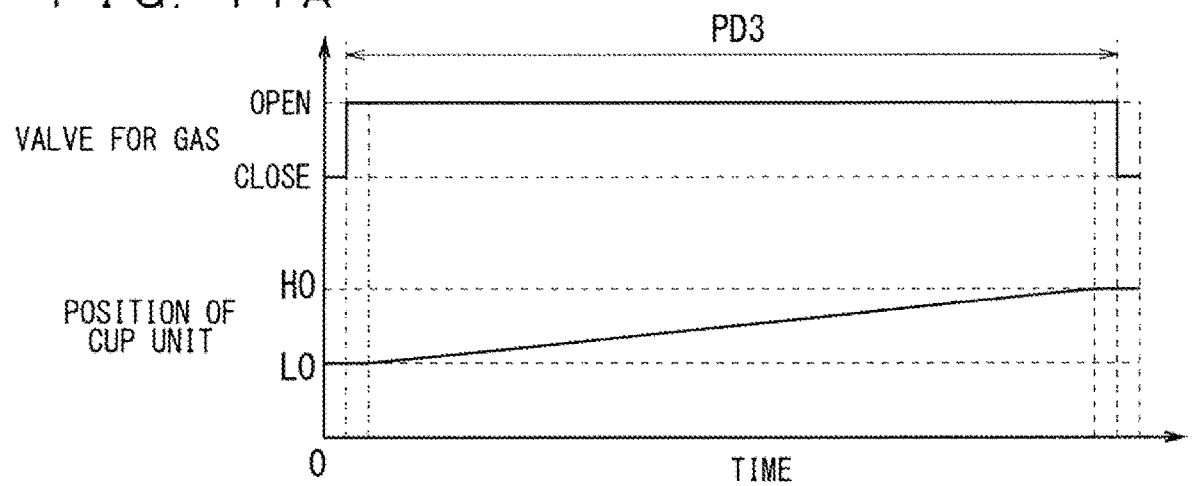
FIGS. 11A and 11B are timing charts each illustrating a change in the position of the cup unit at the time of executing a drying treatment.
Figure 11B:
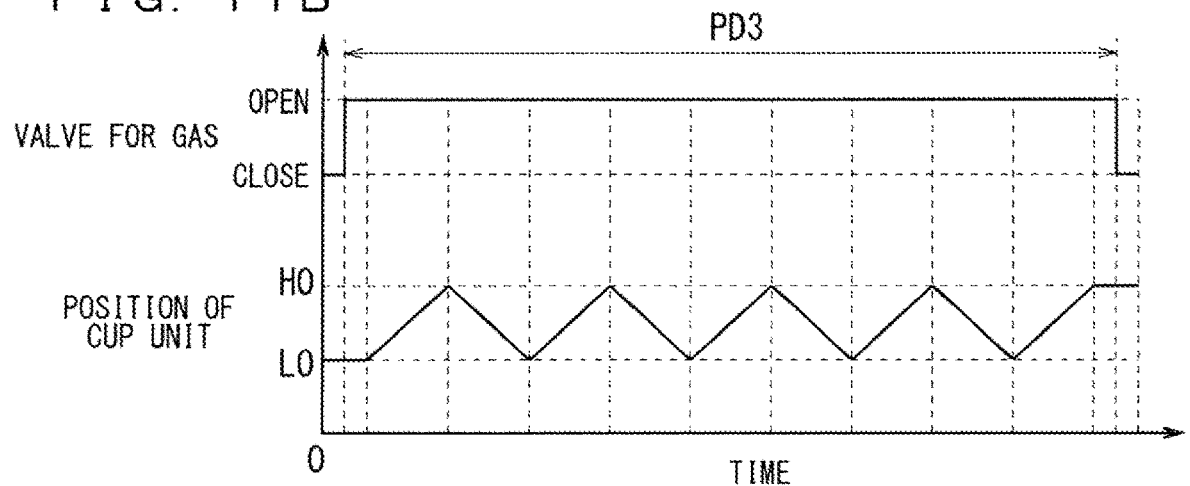

FIGS. 11A and 11B are timing charts each illustrating a change in the position in the vertical direction of the cup unit 30 at the time of executing the drying treatment. Each of FIGS. 11A and 11B illustrates a change over time in the opening and closing of a valve (also referred to as a valve for gas) for supplying gas from the gas supply source 74 to the lower annular flow path 27p and the position in the vertical direction of the cup unit 30 (specifically, the middle cup member 31b).

Here, for example, as illustrated in FIG. 11A, in a period (also referred to as a drying treatment period) PD3 from the timing of opening the valve for gas to start the execution of the drying treatment to the timing of closing the valve for gas to end the execution of the drying treatment, an aspect is conceivable in which the control unit 2 performs control to cause the lifting drive unit 34 to move the relative position in the vertical direction of the cup unit 30 (specifically, the middle cup member 31b) with respect to the spin chuck 20 in the upward direction. Here, as in the example of FIG. 11A, the control unit 2, after starting the execution of the drying treatment, may start the movement of the relative position in the vertical direction of the cup unit 30 (specifically, the middle cup member 31b) with respect to the spin chuck 20 by the lifting drive unit 34. In addition, the control unit 2, before ending the execution of the drying treatment, may end the movement of the relative position in the vertical direction of the cup unit 30 (specifically, the middle cup member 31b) with respect to the spin chuck 20 by the lifting drive unit 34. As a result, for example, since unevenness is less likely to occur in the drying of the liquid adhering to the inner wall surface of the cup unit 30 due to the cleaning treatment or the like, the inner wall surface of the cup unit 30 can be further dried before the chemical liquid treatment on the next substrate W is executed.

In addition, as shown in FIG. 11B, the control unit 2, during the execution of the drying treatment, may cause the lifting drive unit 34 to alternately execute the first operation of moving the relative position in the vertical direction of the cup unit 30 (specifically, the middle cup member 31b) with respect to the spin chuck 20 in the downward direction and the second operation of moving the relative position in the vertical direction of the cup unit 30 (specifically, the middle cup member 31b) with respect to the spin chuck 20 in the upward direction.

<1-4. Summary>

As described above, in the substrate processing apparatus 100 according to the first embodiment, for example, the control unit 2, while causing the rotation mechanism 22 to rotate the spin base 23 and the plurality of chuck pins 24 about the virtual axis P0 and causing the first discharge portion 25o to discharge the chemical liquid toward the lower surface Wb of the substrate W held by the plurality of chuck pins 24 to execute the chemical liquid treatment of treating the lower surface Wb, causes the lifting drive unit 34 to change the relative position in the vertical direction of the cup unit 30 with respect to the spin chuck 20. In other words, for example, when the treatment using the chemical liquid is performed on the substrate W, the liquid receiving region Ar1 that receives the droplets of the chemical liquid scattered from the rotating substrate W on the inner wall surface of the cup unit 30 moves in the vertical direction. Thus, for example, the droplets of the chemical liquid scattered from the rotating substrate W are less likely to collide with the droplets adhering to the inner wall surface of the cup unit 30. As a result, for example, a splash in which a large amount of minute droplets of the chemical liquid splash from the inner wall surface of the cup unit 30 is less likely to occur, and the minute droplets of the chemical liquid are less likely to reach the upper surface Wu of the substrate W. Therefore, for example, contamination of the upper surface Wu of the substrate W and a defect in which an unintended treatment is applied to the upper surface Wu of the substrate W hardly occur, and the quality of the substrate W can be improved.

<2. Modifications>

The present invention is not limited to the above-described first embodiment, and various changes, improvements, and the like can be made without departing from the gist of the present invention.

In the first embodiment described above, for example, the control unit 2, after the execution of the chemical liquid treatment on the first substrate W is completed in the processing unit 1, may prohibit the start of the execution of the chemical liquid treatment on the second substrate W as the next treatment target of the first substrate W in the processing unit 1 until a preset time required for drying the cup unit 30 elapses. When such a configuration is adopted, for example, by sufficiently drying the cup unit 30, during execution of the chemical liquid treatment on the substrate W as the next treatment target, when the inner wall surface of the cup unit 30 receives the droplets of the chemical liquid scattered from the rotating substrate W, a splash in which a large amount of minute droplets of the chemical liquid splash from the inner wall surface of the cup unit 30 is less likely to occur. Therefore, for example, the quality of the substrate W can be improved.

FIG. 12 is a diagram illustrating an example of a flow of processing using the processing unit 1 according to the first modification. The flowchart of FIG. 12 is based on the flowchart of FIG. 7, and if there is an untreated substrate W as a next treatment target in the processing unit 1 in step St6, the flowchart is changed to return to step St2 through steps St7A and St8A instead of returning to step St1. Here, in step St7A, for example, similarly to step St1, the conveyance robot CR carries the untreated substrate W into the processing unit 1 via the carry-in/out port 15 of the processing chamber 140. Next, the control unit 2 determines whether or not a predetermined time has elapsed from a reference timing until a predetermined time has elapsed from the reference timing (step St8A). Here, the determination in step St8A is repeated, and when a predetermined time has elapsed from the reference timing, the process returns to step St2. Here, the reference timing may be, for example, a timing at which the carry-in of the substrate W in step St7A is completed, or may be any timing of the operations in steps St2 to St6. The predetermined time may be a preset time required for drying the cup unit 30. This predetermined time may be obtained in advance by, for example, an experiment using an apparatus having a configuration equivalent to that of the processing unit 1, or may be obtained in advance by a simulation according to the configuration of the processing unit 1. The predetermined time can be set within several minutes, for example. When such a processing flow is adopted, the chemical liquid treatment on the substrate W as the next treatment target can be executed after the cup unit 30 is sufficiently dried.

In the first embodiment, for example, an example has been described in which droplets of the chemical liquid discharged toward the lower surface Wb of the substrate W are scattered toward the liquid receiving region Ar1 of the inner wall surface Iwb of the middle cup member 31b, but the present invention is not limited thereto. Any of the inner cup member 31a and the outer cup member 31c may play the role of the middle cup member 31b instead of the middle cup member 31b.

Figure 13A:
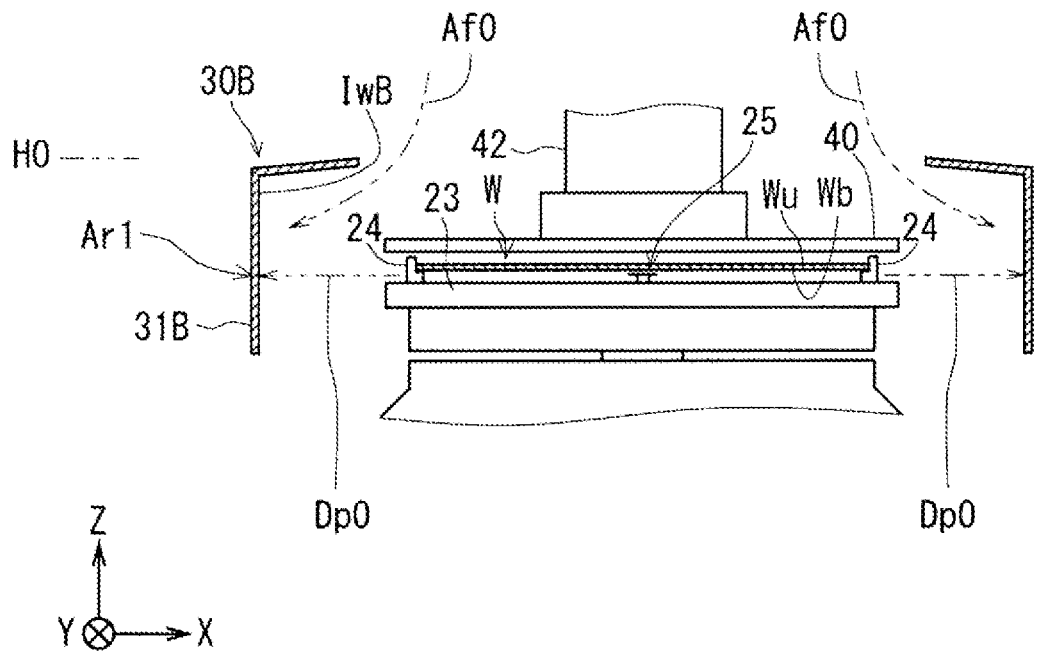
FIGS. 13A and 13B are views schematically illustrating an example of a change in a position of a cup unit in a processing unit according to a second modification.
Figure 13B:
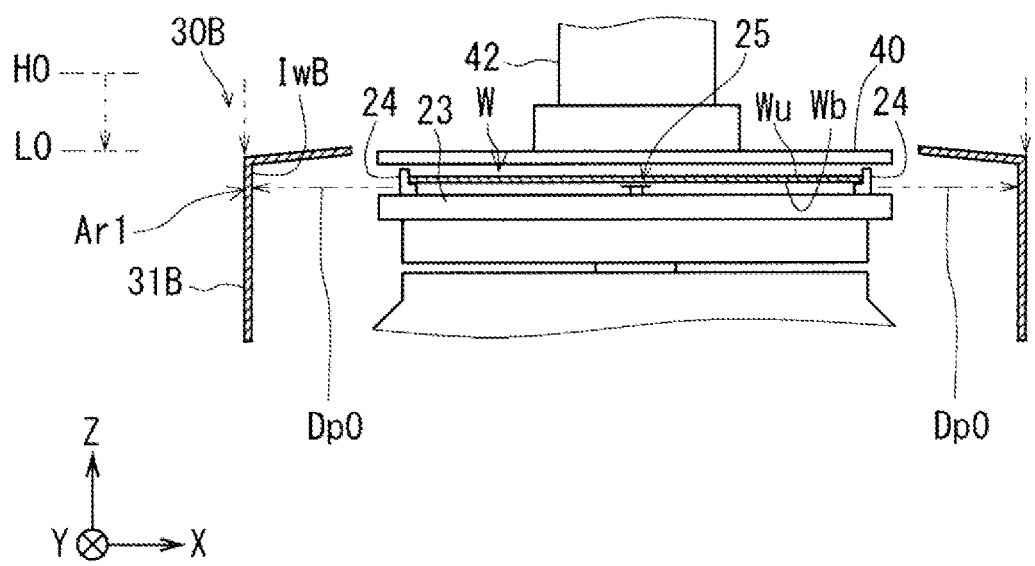

In the first embodiment, for example, the cup unit 30 has a plurality of cup members that can be moved up and down independently of each other by the lifting drive unit 34, but the present invention is not limited thereto. For example, the cup unit 30 may have one or more cup members. FIGS. 13A and 13B are views schematically illustrating an example of movement of a cup unit 30B in the processing unit 1 according to the second modification. The cup unit 30B includes, for example, one cup member 31B that can be moved up and down by the lifting drive unit 34 instead of including the inner cup member 31a, the middle cup member 31b, and the outer cup member 31c as in the cup unit 30 according to the first embodiment. FIG. 13A is a view in which the cup unit 30 in FIG. 8A is replaced with the cup unit 30B. FIG. 13B is a view in which the cup unit 30 in FIG. 8B is replaced with the cup unit 30B. That is, FIGS. 13A and 13B illustrate an example in which the cup member 31B is moved between a predetermined first position H0 that is raised and a predetermined second position L0 that is lowered. In this case, for example, the cup member 31B and its inner wall surface IwB play the role of the middle cup member 31*b* and its inner wall surface Iwb in the first embodiment. FIG. 13A illustrates a state in which the cup member 31B is raised to the predetermined first position H0, and FIG. 13B illustrates a state in which the cup member 31B is lowered to the predetermined second position L0.

Here, for example, immediately before the chemical liquid treatment is started, while the substrate W is rotated about the virtual axis P0 by the spin chuck 20, pretreatment (also referred to as pre-pure water treatment) which causes the second discharge portion 26*o* to discharge pure water to the lower surface Wb of the substrate W to make the pure water adhere to the lower surface Wb may be performed. In this case, for example, before the start of the pre-pure water treatment or before the start of the chemical liquid treatment, the relative position in the vertical direction of the cup member 31B with respect to the spin chuck 20 may be started to be moved in the downward direction by the lifting drive unit 34. As a result, for example, in the initial stage of the chemical liquid treatment, the dried region of the inner wall surface IwB of the cup member 31B, which is not wet by the pre-pure water treatment, can receive droplets of the chemical liquid scattered from the lower surface Wb of the rotating substrate W. As a result, for example, a splash in which a large amount of minute droplets of the chemical liquid splash from the inner wall surface IwB of the cup unit 30B is less likely to occur, and the minute droplets of the chemical liquid are less likely to reach the upper surface Wu of the substrate W. As a result, for example, contamination of the upper surface Wu of the substrate W and a defect in which an unintended treatment is applied to the upper surface Wu of the substrate W hardly occur, and the quality of the substrate W can be improved.

FIG. 14 is a timing chart illustrating a change in the position of the cup unit 30B (specifically, the cup member 31B) at the time of executing the pre-pure water treatment and the chemical liquid treatment according to the second modification. FIG. 14 illustrates a change over time in each of opening and closing of a valve (also referred to as a valve for pure water) for supplying pure water from the pure water supply source 72 to the lower supply portion 25, opening and closing of a valve (also referred to as a valve for chemical liquid) for supplying chemical liquid from the chemical liquid supply source 71 to the lower supply portion 25, and a position in the vertical direction of the cup unit 30B (specifically, the cup member 31B). FIG. 14 shows an example in which from before the start of the pre-pure water treatment to after the end of the chemical liquid treatment, the relative position in the vertical direction of the cup member 31B with respect to the spin chuck 20 is moved in the downward direction by the lifting drive unit 34.

In the first embodiment, for example, the first surface onto which the chemical liquid is discharged when the chemical liquid treatment is executed is the lower surface Wb of the substrate W. However, the present invention is not limited thereto, and the first surface may be the upper surface Wu of the substrate W. Here, for example, it may be possible to discharge the chemical liquid from the upper supply portion 46 provided in the blocking member 40 toward the upper surface Wu of the substrate W, or it may be possible to discharge the chemical liquid from a nozzle movable between a region between the blocking member 40 disposed at a position separated from the spin base 23 and the spin base 23 and a region retracted from above the spin base 23 toward the upper surface Wu of the substrate W. Note that, in this case, for the spin base 23, for example, instead of the plurality of chuck pins 24, another configuration capable of holding the substrate W such as a vacuum chuck capable of adsorbing the lower surface Wb of the substrate W may be adopted.

Figure 15:
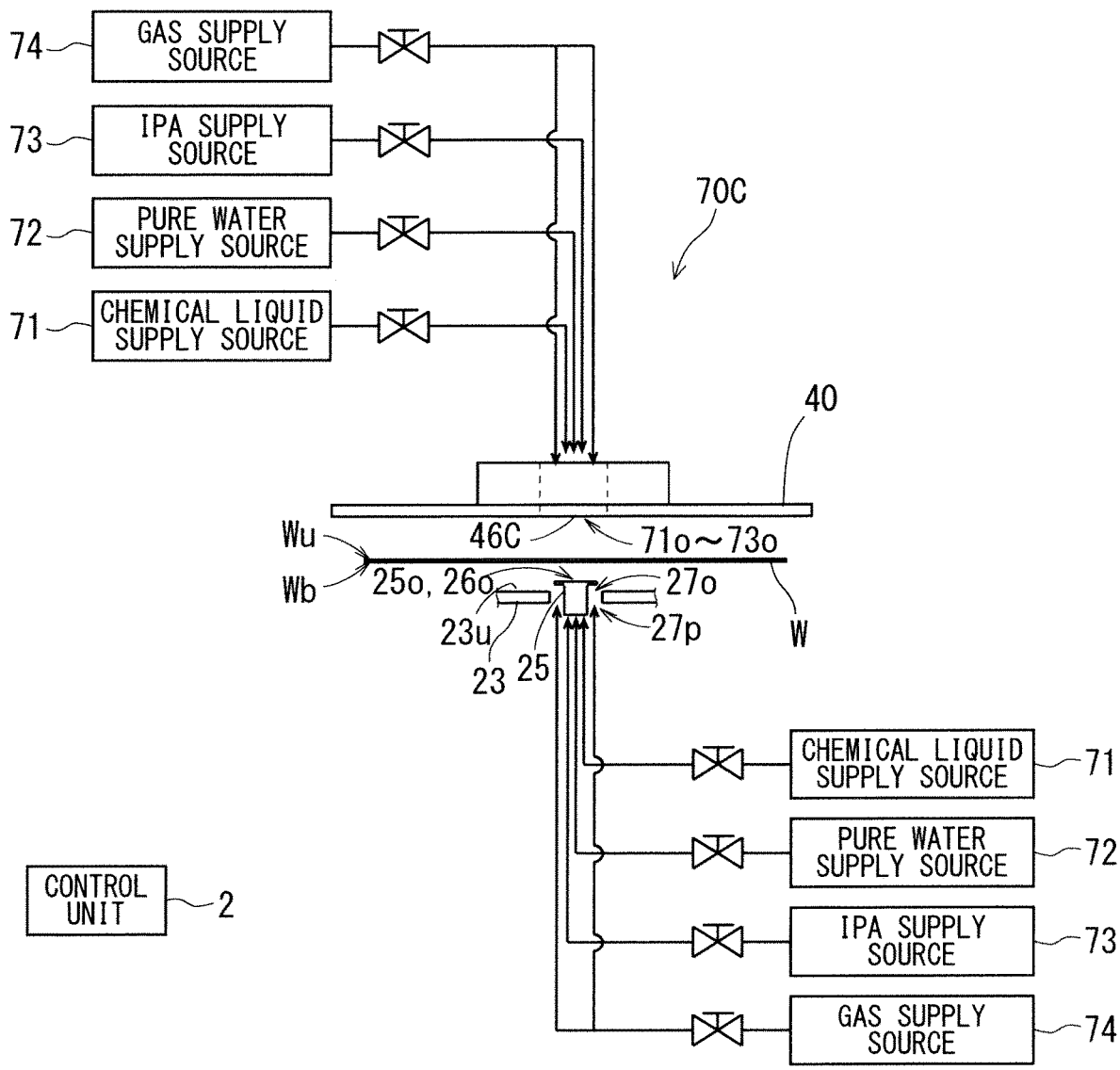
FIG. 15 is a schematic block diagram illustrating an example of a gas-liquid supply portion according to a third modification.

FIG. 15 is a schematic block diagram illustrating an example of a gas-liquid supply portion 70C according to a third modification. The gas-liquid supply portion 70C is based on the gas-liquid supply portion 70 according to the first embodiment, and the upper supply portion 46 is changed to an upper supply portion 46C further including a sixth discharge portion 710 as a chemical liquid discharge portion capable of discharging a chemical liquid supplied from the chemical liquid supply source 71 via a valve toward the upper surface Wu of the substrate W. In the example of FIG. 15, by discharging the chemical liquid toward the upper surface Wu of the substrate W rotated about the virtual axis P0 by the spin chuck 20 by the sixth discharge portion 71*o*, it is possible to execute the chemical liquid treatment on the upper surface Wu of the substrate W.

Figure 16:
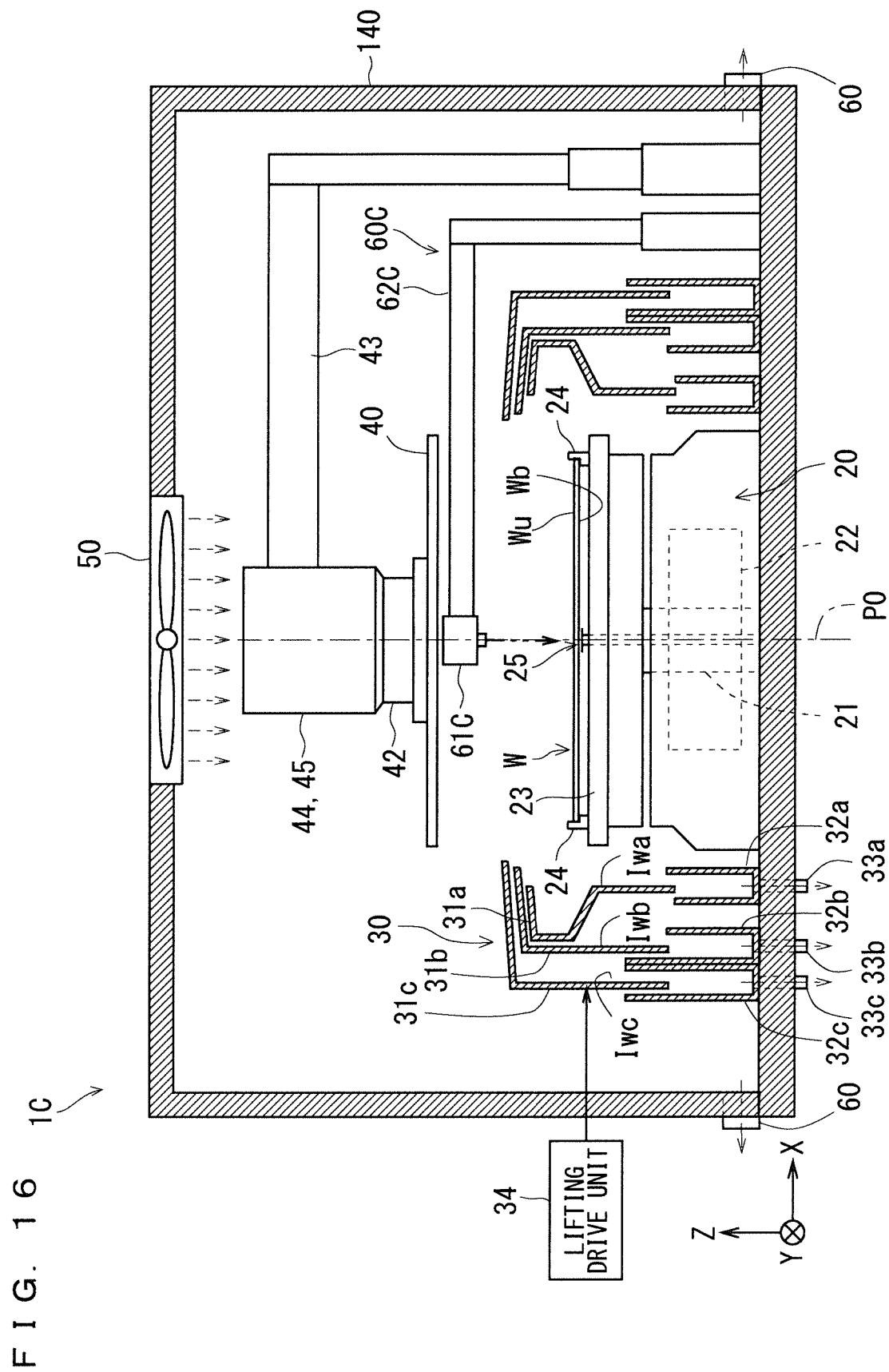
FIG. 16 is a side view schematically illustrating a configuration example of a processing unit according to the third modification.

FIG. 16 is a side view schematically illustrating a configuration example of a processing unit 1C according to the third modification. In the example of FIG. 16, the processing unit 1C is based on the processing unit 1 according to the first embodiment, and is added with a treatment liquid supply portion 60C in which a nozzle portion 61C as the chemical liquid discharge portion is movable between the region between the blocking member 40 and the spin base 23 and the region retracted from above the spin base 23 by the rotation of an arm 62C in a state where the blocking member 40 is disposed at the position separated from the spin base 23. FIG. 16 illustrates a state in which the nozzle portion 61C is positioned in a region between the blocking member 40 and the spin base 23. In the example of FIG. 16, the nozzle portion 61C, in a state of being positioned in the region between the blocking member 40 and the spin base 23, can discharge the chemical liquid toward the upper surface Wu of the substrate W rotated about the virtual axis P0 by the spin chuck 20.

When the chemical liquid treatment is executed on the upper surface Wu, for example, a gas is discharged toward the lower surface Wb of the substrate W by the third discharge portion 27*o*. Here, similarly to when the chemical liquid treatment is executed on the lower surface Wb in the first embodiment, if the position in the vertical direction of the cup unit 30 with respect to the spin chuck 20 is changed by the lifting drive unit 34, a splash in which a large amount of minute droplets of the chemical liquid splash from the inner wall surface of the cup unit 30 is less likely to occur, and the minute droplets of the chemical liquid are less likely to reach the lower surface Wb of the substrate W. As a result, for example, contamination of the lower surface Wb of the substrate W and a defect in which an unintended treatment is applied to the lower surface Wb of the substrate W hardly occur, and the quality of the substrate W can be improved.

Figure 17A:
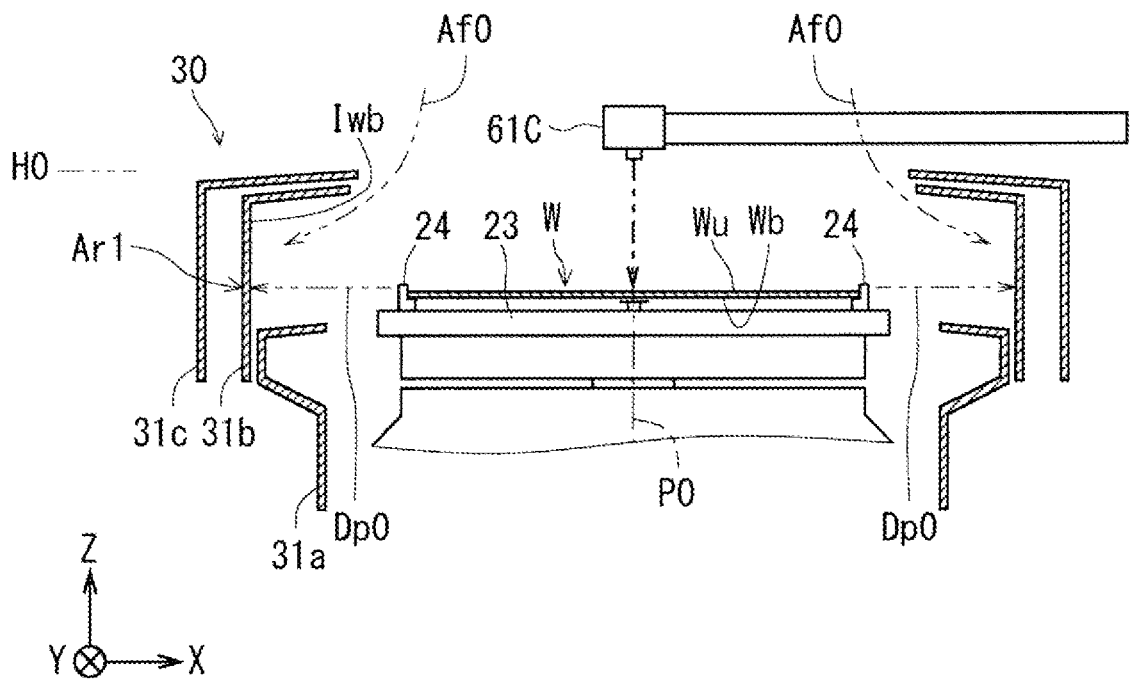
FIGS. 17A and 17B are views schematically showing an example of a change in a position of a cup unit at the time of executing substrate processing according to the third modification.
Figure 17B:
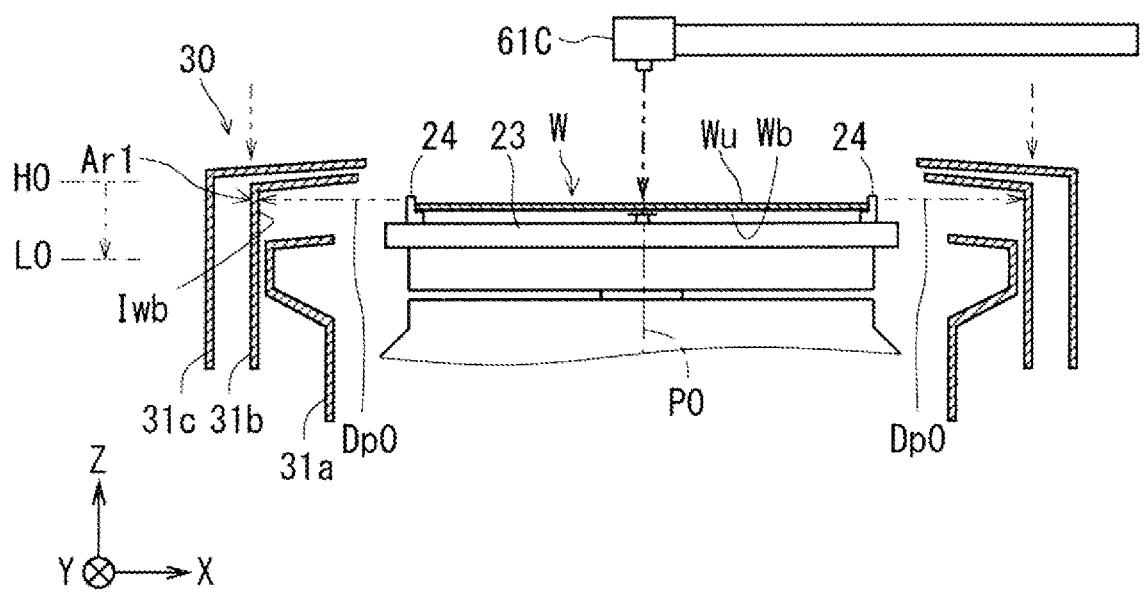

FIGS. 17A and 17B are views schematically illustrating an example of a change in the position of the cup unit 30 during execution of the substrate treatment according to the third modification. In the examples of FIGS. 17A and 17B, similarly to the examples of FIGS. 8A and 8B, in a state where the inner cup member 31*a* is lowered to the lowermost portion, the middle cup member 31*b* and the outer cup member 31*c* are moved between the raised predetermined first position H0 and the lowered predetermined second position L0. FIG. 17A illustrates a state in which the middle cup member 31*b* and the outer cup member 31*c* are raised to the predetermined first position H0, and FIG. 17B illustrates a state in which the middle cup member 31b and the outer cup member 31c are lowered to the predetermined second position L0. In addition, in FIGS. 17A and 17B, a path in which the droplet of the chemical liquid discharged toward the upper surface Wu of the substrate W by the nozzle portion 61C is scattered toward the cup unit 30 by the rotation of the substrate W about the virtual axis P0 by the spin chuck 20 is drawn by an arrow Dp0 of a two-dot chain line. Specifically, a state in which droplets of the chemical liquid discharged toward the upper surface Wu of the substrate W are scattered toward the liquid receiving region Ar1 of the inner wall surface Iwb of the middle cup member 31b is illustrated. Further, in FIG. 17A, as in FIG. 8A, an example of a downflow path of the clean air from the FFU 50 toward the inside (specifically, the inner wall surface Iwb of the middle cup member 31b) of the cup unit 30 is drawn by an arrow Af0 of a two-dot chain line.

Here, for example, in a period (chemical liquid treatment period) in which the control unit 2 executes the chemical liquid treatment of treating the upper surface Wu by discharging the chemical liquid toward the upper surface Wu of the substrate W by the nozzle portion 61C, if the control unit 2 causes the lifting drive unit 34 to change the relative position in the vertical direction of the cup unit 30 with respect to the spin chuck 20, the liquid receiving region Ar1 that receives the droplets of the chemical liquid scattered from the rotating substrate W on the inner wall surface of the cup unit 30 moves in the vertical direction. Thus, for example, the droplets of the chemical liquid scattered from the rotating substrate W are less likely to collide with the droplets adhering to the inner wall surface (the inner wall surface Iwb of the middle cup member 31b in the example of FIGS. 17A and 17B) of the cup unit 30. As a result, for example, a splash in which a large amount of minute droplets of the chemical liquid splash from the inner wall surface of the cup unit 30 is less likely to occur. Therefore, for example, the minute droplets of the chemical liquid are less likely to reach the lower surface Wb of the substrate W that is not the target of the chemical liquid treatment, and the minute droplets of the chemical liquid are less likely to reach the upper surface Wu of the substrate W that is the target of the chemical liquid treatment. As a result, for example, contamination of the lower surface Wb of the substrate W and a defect in which unintended treatment is applied to the lower surface Wb of the substrate W hardly occur. In addition, for example, contamination of the upper surface Wu of the substrate W and a defect in which an unintended excessive treatment is applied to the upper surface Wu of the substrate W hardly occur. Therefore, the quality of the substrate W can be improved. To an aspect for causing the lifting drive unit 34 to change the relative position in the vertical direction of the cup unit 30 with respect to the spin chuck 20, for example, as in the first embodiment, an aspect for causing the lifting drive unit 34 to move the relative position in the vertical direction of the cup unit 30 (for example, the middle cup member 31b) with respect to the spin chuck 20 in the downward direction and not to move the relative position in the upward direction may be applied, or an aspect for causing the lifting drive unit 34 to alternately execute the first operation of moving the relative position in the vertical direction of the cup unit 30 (for example, the middle cup member 31b) with respect to the spin chuck 20 in the downward direction and the second operation of moving the relative position in the vertical direction of the cup unit 30 (for example, the middle cup member 31b) with respect to the spin chuck 20 in the upward direction may be applied.

In the first embodiment, for example, the first discharge portion 25o as the chemical liquid discharge portion and the second discharge portion 26o as the cleaning liquid discharge portion in the lower supply portion 25 may be separate discharge portions or the same discharge portion. For example, the sixth discharge portion 710 as the chemical liquid discharge portion and the fifth discharge portion 73o as the cleaning liquid discharge portion in the upper supply portion 46 may be separate discharge portions or the same discharge portion.

In the first embodiment, for example, if an aspect for causing the lifting drive unit 34 to move the relative position in the vertical direction of the cup unit 30 (for example, the middle cup member 31b) with respect to the spin chuck 20 in the downward direction at the end of the chemical liquid treatment period PD1 is adopted, unintended treatment and excessive treatment are unlikely to occur on the upper surface Wu and the lower surface Wb of the substrate W until the cleaning treatment period PD2 is started.

In the first embodiment, for example, the relative position in the vertical direction of the cup unit 30 with respect to the spin chuck 20 is changed by the lifting drive unit 34 by causing the lifting drive unit 34 to move the cup unit 30 up and down, but the present invention is not limited thereto. For example, the lifting drive unit 34 may be capable of changing the relative position in the vertical direction of the cup unit 30 with respect to the spin chuck 20 by moving at least one of the spin chuck 20 and the cup unit 30 up and down.

In the first embodiment, for example, when the relative position in the vertical direction of the cup unit 30 with respect to the spin chuck 20 is moved in the downward direction by the lifting drive unit 34, the relative position in the vertical direction of the cup unit 30 with respect to the spin chuck 20 may be moved in the downward direction while finely vibrating or swinging the relative position in the vertical direction of the cup unit 30 with respect to the spin chuck 20. Therefore, an aspect for performing control to cause the lifting drive unit 34 to move the relative position in the vertical direction of the cup unit 30 with respect to the spin chuck 20 in the downward direction and not to move the relative position in the upward direction includes, for example, an aspect for moving the relative position in the vertical direction of the cup unit 30 with respect to the spin chuck 20 in the downward direction while changing, such as finely vibrating or swinging, the relative position in the vertical direction of the cup unit 30 with respect to the spin chuck 20. In addition, for example, during at least one of the first operation of causing the lifting drive unit 34 to move the relative position in the vertical direction of the cup unit 30 with respect to the spin chuck 20 in the downward direction and the second operation of causing the lifting drive unit 34 to move the relative position in the vertical direction of the cup unit 30 with respect to the spin chuck 20 in the upward direction, the relative position in the vertical direction of the cup unit 30 with respect to the spin chuck 20 may be changed such as being finely vibrated or swung.

In the first embodiment, for example, a sensor such as an imaging element capable of monitoring the dry state of the inner wall surface of the cup unit 30 may be provided in the processing unit 1, and various types of image processing such as binarization processing may be applied to an image obtained by the sensor, so that the dry state of the inner wall surface of the cup unit 30 may be made recognizable. In this case, for example, according to the recognition result of the dry state of the inner wall surface of the cup unit 30, the control unit 2, in the chemical liquid treatment period PD1, in order to scatter the droplets of the chemical liquid from the substrate W toward the dried portion of the inner wall surface Iwb, may control the speed at which the lifting drive unit 34 moves the relative position in the vertical direction of the cup unit 30 with respect to the spin chuck 20 in the downward direction.

It goes without saying that all or a part of each of the first embodiment and the various modifications can be appropriately combined within a consistent range.

EXPLANATION OF REFERENCE SIGNS 1, 1C: processing unit
2: control unit
20: spin chuck
22: rotation mechanism
23: spin base
24: chuck pin
25: lower supply portion
25o: first discharge portion
26o: second discharge portion
27o: third discharge portion
30, 30B: cup unit
31B: cup member
31a: inner cup member
31b: middle cup member
31c: outer cup member
34: lifting drive unit
40: blocking member
46, 46C: upper supply portion
60C: treatment liquid supply portion
61C: nozzle portion
70, 70C: gas-liquid supply portion
71o: sixth discharge portion
72o: fourth discharge portion
73o: fifth discharge portion
100: substrate processing apparatus
205: processing unit
Ar1: liquid receiving region
H0: first position
L0: second position
P0: virtual axis
PD1: chemical liquid treatment period
PD2: cleaning treatment period
PD3: drying treatment period
Pg1: program
W: substrate
Wb: lower surface
Wu: upper surface

The invention claimed is:

1. A substrate processing method in a substrate processing apparatus, in which
said substrate processing apparatus includes a processing unit, and
said processing unit includes:
a substrate holding unit capable of holding a substrate having a first surface and a second surface opposite to the first surface in a horizontal posture;
a first drive unit capable of rotating said substrate holding unit about a virtual axis;
a chemical liquid discharge portion capable of discharging a chemical liquid toward said first surface of said substrate held by said substrate holding unit;
a cup unit surrounding a periphery of said substrate holding unit; and
a second drive unit capable of changing a relative position in a vertical direction of said cup unit with respect to said substrate holding unit,
said substrate processing method comprising:
a first step of while causing said first drive unit to rotate said substrate holding unit about said virtual axis, causing said chemical liquid discharge portion to discharge said chemical liquid toward said first surface of said substrate held by said substrate holding unit to execute a chemical liquid treatment of treating said first surface;
a second step of causing, during execution of said chemical liquid treatment in said first step, said second drive unit to change said relative position in said vertical direction of said cup unit with respect to said substrate holding unit; and
in said second step, causing said second drive unit to move said relative position in said vertical direction of said cup unit with respect to said substrate holding unit first in a downward direction in a chemical liquid treatment period in said first step from a first timing at which execution of said chemical liquid treatment is started to a second timing at which the execution of said chemical liquid treatment is ended, and causing one cup member of said cup unit to receive said chemical liquid scattered from said substrate from beginning to end of said chemical liquid treatment period.

2. The substrate processing method according to claim 1, said method comprising, during execution of said chemical liquid treatment, causing said second drive unit to alternately execute a first operation of moving a relative position in said vertical direction of said cup unit with respect to said substrate holding unit in a downward direction and a second operation of moving the relative position in said vertical direction of said cup unit with respect to said substrate holding unit in an upward direction.

3. The substrate processing method according to claim 1, wherein said processing unit includes a cleaning liquid discharge portion that discharges a cleaning liquid toward said first surface of said substrate held by said substrate holding unit,
said method comprising, after execution of said chemical liquid treatment, while causing said first drive unit to rotate said substrate holding unit about said virtual axis and causing said cleaning liquid discharge portion to discharge said cleaning liquid toward said first surface of said substrate held by said substrate holding unit to execute a cleaning treatment of cleaning said first surface, causing said second drive unit to change a relative position in said vertical direction of said cup unit with respect to said substrate holding unit.

4. The substrate processing method according to claim 1, said method comprising, after completion of execution of said chemical liquid treatment on a first substrate, prohibiting start of execution of said chemical liquid treatment on a second substrate next to said first substrate until a preset time required for drying said cup unit elapses.

5. The substrate processing method according to claim 1, said method comprising, in a chemical liquid treatment period from a first timing at which execution of said chemical liquid treatment is started to a second timing at which the execution of said chemical liquid treatment is ended, causing said second drive unit to move a relative position in said vertical direction of said cup unit with respect to said substrate holding unit in a downward direction and not to move said relative position in an upward direction.

6. The substrate processing method according to claim 5, said method comprising, in said chemical liquid treatment period, in order to scatter a droplet of said chemical liquid from said substrate toward a dried portion of an inner wall surface of said cup unit, causing said second drive unit to move a relative position in said vertical direction of said cup unit with respect to said substrate holding unit in said downward direction.

7. A substrate processing method in a substrate processing apparatus, in which
said substrate processing apparatus includes a processing unit, and
said processing unit includes:
a substrate holding unit capable of holding a substrate having a first surface and a second surface opposite to the first surface in a horizontal posture;
a first drive unit capable of rotating said substrate holding unit about a virtual axis;
a chemical liquid discharge portion capable of discharging a chemical liquid toward said first surface of said substrate held by said substrate holding unit;
a cup unit surrounding a periphery of said substrate holding unit; and
a second drive unit capable of changing a relative position in a vertical direction of said cup unit with respect to said substrate holding unit,
said substrate processing method comprising:
a first step of while causing said first drive unit to rotate said substrate holding unit about said virtual axis, causing said chemical liquid discharge portion to discharge said chemical liquid toward said first surface of said substrate held by said substrate holding unit to execute a chemical liquid treatment of treating said first surface;
a second step of causing, during execution of said chemical liquid treatment in said first step, said second drive unit to change said relative position in said vertical direction of said cup unit with respect to said substrate holding unit;
causing said second drive unit to move said relative position in said vertical direction of said cup unit with respect to said substrate holding unit in a downward direction and not to move said relative position in an upward direction, in a chemical liquid treatment period from a first timing at which execution of said chemical liquid treatment is started to a second timing at which the execution of said chemical liquid treatment is ended; and
causing said second drive unit to continue to move said relative position in said vertical direction of said cup unit with respect to said substrate holding unit in said downward direction during said chemical liquid treatment period until end of said chemical liquid treatment period, and stopping the movement.

8. A substrate processing method in a substrate processing apparatus, in which
said substrate processing apparatus includes a processing unit, and
said processing unit includes:
a substrate holding unit capable of holding a substrate having a first surface and a second surface opposite to the first surface in a horizontal posture;
a first drive unit capable of rotating said substrate holding unit about a virtual axis;
a chemical liquid discharge portion capable of discharging a chemical liquid toward said first surface of said substrate held by said substrate holding unit;
a cup unit surrounding a periphery of said substrate holding unit; and
a second drive unit capable of changing a relative position in a vertical direction of said cup unit with respect to said substrate holding unit,
said substrate processing method comprising:
a first step of while causing said first drive unit to rotate said substrate holding unit about said virtual axis, causing said chemical liquid discharge portion to discharge said chemical liquid toward said first surface of said substrate held by said substrate holding unit to execute a chemical liquid treatment of treating said first surface;
a second step of causing, during execution of said chemical liquid treatment in said first step, said second drive unit to change said relative position in said vertical direction of said cup unit with respect to said substrate holding unit;
causing said second drive unit to move said relative position in said vertical direction of said cup unit with respect to said substrate holding unit in a downward direction and not to move said relative position in an upward direction, in a chemical liquid treatment period from a first timing at which execution of said chemical liquid treatment is started to a second timing at which the execution of said chemical liquid treatment is ended; and
before said first timing, starting movement of said relative position in said vertical direction of said cup unit with respect to said substrate holding unit in said downward direction by said second drive unit.

9. A substrate processing method in a substrate processing apparatus, in which
said substrate processing apparatus includes a processing unit, and
said processing unit includes:
a substrate holding unit capable of holding a substrate having a first surface and a second surface opposite to the first surface in a horizontal posture;
a first drive unit capable of rotating said substrate holding unit about a virtual axis;
a chemical liquid discharge portion capable of discharging a chemical liquid toward said first surface of said substrate held by said substrate holding unit;
a cup unit surrounding a periphery of said substrate holding unit; and
a second drive unit capable of changing a relative position in a vertical direction of said cup unit with respect to said substrate holding unit,
said substrate processing method comprising:
a first step of while causing said first drive unit to rotate said substrate holding unit about said virtual axis, causing said chemical liquid discharge portion to discharge said chemical liquid toward said first surface of said substrate held by said substrate holding unit to execute a chemical liquid treatment of treating said first surface;
a second step of causing, during execution of said chemical liquid treatment in said first step, said second drive unit to change said relative position in said vertical direction of said cup unit with respect to said substrate holding unit;
causing, during execution of said chemical liquid treatment, said second drive unit to alternately execute a first operation of moving said relative position in said vertical direction of said cup unit with respect to said substrate holding unit in a downward direction and a second operation of moving said relative position in said vertical direction of said cup unit with respect to said substrate holding unit in an upward direction; and during execution of said chemical liquid treatment, when causing said second drive unit to execute said second operation, stopping discharge of said chemical liquid by said chemical liquid discharge portion toward said first surface of said substrate held by said substrate holding unit.

10. A substrate processing method in a substrate processing apparatus, in which said substrate processing apparatus includes a processing unit, and said processing unit includes:

a substrate holding unit capable of holding a substrate having a first surface and a second surface opposite to the first surface in a horizontal posture;

a first drive unit capable of rotating said substrate holding unit about a virtual axis;

a chemical liquid discharge portion capable of discharging a chemical liquid toward said first surface of said substrate held by said substrate holding unit;

a cup unit surrounding a periphery of said substrate holding unit; and a second drive unit capable of changing a relative position in a vertical direction of said cup unit with respect to said substrate holding unit, said substrate processing method comprising:

a first step of while causing said first drive unit to rotate said substrate holding unit about said virtual axis, causing said chemical liquid discharge portion to discharge said chemical liquid toward said first surface of said substrate held by said substrate holding unit to execute a chemical liquid treatment of treating said first surface;

a second step of causing, during execution of said chemical liquid treatment in said first step, said second drive unit to change said relative position in said vertical direction of said cup unit with respect to said substrate holding unit;

causing, during execution of said chemical liquid treatment, said second drive unit to alternately execute a first operation of moving said relative position in said vertical direction of said cup unit with respect to said substrate holding unit in a downward direction and a second operation of moving said relative position in said vertical direction of said cup unit with respect to said substrate holding unit in an upward direction; and before causing said second drive unit to stop execution of said first operation and said second operation, stopping discharge of said chemical liquid by said chemical liquid discharge portion toward said first surface of said substrate held by said substrate holding unit.

11. A substrate processing method in a substrate processing apparatus, in which said substrate processing apparatus includes a processing unit, and said processing unit includes:

a substrate holding unit capable of holding a substrate having a first surface and a second surface opposite to the first surface in a horizontal posture;

a first drive unit capable of rotating said substrate holding unit about a virtual axis;

a chemical liquid discharge portion capable of discharging a chemical liquid toward said first surface of said substrate held by said substrate holding unit;

a cup unit surrounding a periphery of said substrate holding unit; and a second drive unit capable of changing a relative position in a vertical direction of said cup unit with respect to said substrate holding unit, said substrate processing method comprising:

a first step of while causing said first drive unit to rotate said substrate holding unit about said virtual axis, causing said chemical liquid discharge portion to discharge said chemical liquid toward said first surface of said substrate held by said substrate holding unit to execute a chemical liquid treatment of treating said first surface;

a second step of causing, during execution of said chemical liquid treatment in said first step, said second drive unit to change said relative position in said vertical direction of said cup unit with respect to said substrate holding unit;

causing, during execution of said chemical liquid treatment, said second drive unit to alternately execute a first operation of moving said relative position in said vertical direction of said cup unit with respect to said substrate holding unit in a downward direction and a second operation of moving said relative position in said vertical direction of said cup unit with respect to said substrate holding unit in an upward direction; and after causing said second drive unit to start execution of said first operation and said second operation, starting discharge of said chemical liquid by said chemical liquid discharge portion toward said first surface of said substrate held by said substrate holding unit.

12. A substrate processing method in a substrate processing apparatus, in which said substrate processing apparatus includes a processing unit, and said processing unit includes:

a substrate holding unit capable of holding a substrate having a first surface and a second surface opposite to the first surface in a horizontal posture;

a first drive unit capable of rotating said substrate holding unit about a virtual axis;

a chemical liquid discharge portion capable of discharging a chemical liquid toward said first surface of said substrate held by said substrate holding unit;

a cup unit surrounding a periphery of said substrate holding unit; and a second drive unit capable of changing a relative position in a vertical direction of said cup unit with respect to said substrate holding unit, said substrate processing method comprising:

a first step of while causing said first drive unit to rotate said substrate holding unit about said virtual axis, causing said chemical liquid discharge portion to discharge said chemical liquid toward said first surface of said substrate held by said substrate holding unit to execute a chemical liquid treatment of treating said first surface; and a second step of causing, during execution of said chemical liquid treatment in said first step, said second drive unit to change said relative position in said vertical direction of said cup unit with respect to said substrate holding unit;

wherein said processing unit includes:
a cleaning liquid discharge portion that discharges a cleaning liquid toward said first surface of said substrate held by said substrate holding unit; and
a gas discharge portion that discharges a gas toward said first surface of said substrate held by said substrate holding unit,
said method comprising:
sequentially executing said chemical liquid treatment, a cleaning treatment of while causing said first drive unit to rotate said substrate holding unit about said virtual axis, causing said cleaning liquid discharge portion to discharge said cleaning liquid toward said first surface of said substrate held by said substrate holding unit to clean said first surface, and a drying treatment of while causing said first drive unit to rotate said substrate holding unit about said virtual axis, causing said gas discharge portion to discharge said gas toward said first surface of said substrate held by said substrate holding unit to dry said first surface; and
while executing said drying treatment, causing said second drive unit to change said relative position in said vertical direction of said cup unit with respect to said substrate holding unit.

13. A substrate processing method in a substrate processing apparatus, in which
said substrate processing apparatus includes a processing unit, and
said processing unit includes:
a substrate holding unit capable of holding a substrate having a first surface and a second surface opposite to the first surface in a horizontal posture;
a first drive unit capable of rotating said substrate holding unit about a virtual axis;
a chemical liquid discharge portion capable of discharging a chemical liquid toward said first surface of said substrate held by said substrate holding unit;
a cup unit surrounding a periphery of said substrate holding unit; and
a second drive unit capable of changing a relative position in a vertical direction of said cup unit with respect to said substrate holding unit,
said substrate processing method comprising:
a first step of while causing said first drive unit to rotate said substrate holding unit about said virtual axis, causing said chemical liquid discharge portion to discharge said chemical liquid toward said first surface of said substrate held by said substrate holding unit to execute a chemical liquid treatment of treating said first surface; and
a second step of causing, during execution of said chemical liquid treatment in said first step, said second drive unit to change said relative position in said vertical direction of said cup unit with respect to said substrate holding unit;
wherein said processing unit includes a protective portion capable of covering said second surface of said substrate held by said substrate holding unit,
said method comprising, when executing said chemical liquid treatment, causing said protective portion to cover said second surface without discharging liquid onto said second surface,
wherein said first surface is a lower surface of said substrate, and said second surface is an upper surface of said substrate.

* * * * *